US008169424B2

(12) United States Patent
Miyazawa et al.

(10) Patent No.: US 8,169,424 B2
(45) Date of Patent: *May 1, 2012

(54) ACTIVE MATRIX DISPLAY DEVICE

(75) Inventors: Toshio Miyazawa, Chiba (JP); Iwao Takemoto, Mobara (JP); Atsushi Hasegawa, Togane (JP); Masahiro Maki, Mobara (JP); Kazutaka Goto, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 944 days.

This patent is subject to a terminal disclaimer.

(21) Appl. No.: 12/127,242

(22) Filed: May 27, 2008

(65) Prior Publication Data

US 2008/0297501 A1    Dec. 4, 2008

Related U.S. Application Data

(63) Continuation of application No. 11/797,033, filed on Apr. 30, 2007, now Pat. No. 7,397,472, which is a continuation of application No. 10/857,944, filed on Jun. 2, 2004, now Pat. No. 7,274,362, which is a continuation of application No. 09/981,804, filed on Oct. 19, 2001, now Pat. No. 6,801,194.

(30) Foreign Application Priority Data

Oct. 20, 2000  (JP) ................. 2000-320745
Sep. 27, 2001  (JP) ................. 2001-296176

(51) Int. Cl.
*G09G 5/00*     (2006.01)

(52) U.S. Cl. .............................. 345/204; 345/87; 345/98
(58) Field of Classification Search ............ 345/87–100, 345/204–206, 208, 210–214; 349/42, 151
See application file for complete search history.

(56) References Cited

U.S. PATENT DOCUMENTS

| 4,295,055 | A |  | 10/1981 | Takemoto et al. |
|---|---|---|---|---|
| 4,538,288 | A | * | 8/1985 | Soneda et al. ............. 377/76 |
| 5,648,790 | A |  | 7/1997 | Lee |
| 5,701,136 | A |  | 12/1997 | Huq et al. |
| 5,748,165 | A |  | 5/1998 | Kubota et al. |
| 5,859,630 | A |  | 1/1999 | Huq |
| 5,949,397 | A |  | 9/1999 | Koyama et al. |
| 6,215,346 | B1 |  | 4/2001 | Cairns et al. |
| 6,323,071 | B1 |  | 11/2001 | Zhang et al. |
| 6,525,719 | B2 |  | 2/2003 | Yamazaki et al. |
| 6,621,481 | B1 | * | 9/2003 | Kanbara .................. 345/100 |
| 6,771,239 | B1 |  | 8/2004 | Uchiyama |
| 6,801,194 | B2 | * | 10/2004 | Miyazawa et al. ........ 345/204 |

(Continued)

FOREIGN PATENT DOCUMENTS

| JP | 52-141548 | 11/1977 |
|---|---|---|
| JP | 54-161288 | 12/1979 |
| JP | 63-023414 | 1/1988 |

*Primary Examiner* — Richard Hjerpe
*Assistant Examiner* — Mansour M Said
(74) *Attorney, Agent, or Firm* — Antonelli, Terry, Stout & Kraus, LLP.

(57) ABSTRACT

A display device includes a dynamic ratioless shift register which is operated in a stable manner and can expand the degree of freedom of design. In the dynamic ratioless shift register which is provided with thin film transistors having semiconductor layers made of p-Si on a substrate surface, a node which becomes the floating state is connected to a fixed potential through a capacitance element.

9 Claims, 15 Drawing Sheets

U.S. PATENT DOCUMENTS

| | | |
|---|---|---|
| 7,116,298 B2 | 10/2006 | Miyazawa et al. |
| 7,274,362 B2 * | 9/2007 | Miyazawa et al. ............ 345/204 |
| 7,397,472 B2 * | 7/2008 | Miyazawa et al. ............ 345/204 |
| 2001/0022571 A1 | 9/2001 | Nakano et al. |

* cited by examiner

ACTIVE MATRIX DISPLAY DEVICE

CROSS-REFERENCE TO RELATED APPLICATIONS

This application is a continuation application of application Ser. No. 11/797,033, filed Apr. 30, 2007, now U.S. Pat. No. 7,397,472 which, in turn, is a continuation application of Ser. No. 10/857,944, filed Jun. 2, 2004 (now U.S. Pat. No. 7,274,362), and, which, in turn, is a continuation application of application Ser. No. 09/981,804, filed Oct. 19, 2001 (now U.S. Pat. No. 6,801,194), the entire application disclosures of which are hereby incorporated by reference.

BACKGROUND OF THE INVENTION

The present invention relates to a display device, and, more particularly, to an active matrix type display device thereof.

In an active matrix type liquid crystal display device, pixel regions are formed on a liquid crystal side surface of one of a pair of substrates, which are arranged so as to face each other in an opposed manner, with a liquid crystal being disposed therebetween. The pixels are formed as regions which are surrounded by gate signal lines that extend in the x direction and are arranged in parallel in the y direction and drain signal lines that extend in the y direction and are arranged in parallel in the x direction.

Each pixel region is provided with a thin film transistor, which is operated upon receiving a scanning signal from one gate signal line, and a pixel electrode to which video signals from the drain signal line are supplied through the thin film transistor.

This pixel electrode generates an electric field between the pixel electrode and a counter electrode which is formed on the other substrate side, for example, and the light transmittivity of the liquid crystal disposed between these electrodes is controlled by this electric field.

Such a liquid crystal display device is provided with a scanning signal driving circuit, which supplies scanning signals to respective gate signal lines and a video signal line driving circuit which supplies video signals to respective drain signal lines.

In view of the fact that the scanning signal driving circuit and the video signal line driving circuit are constituted of a large number of MIS transistors having a constitution similar to that of the thin film transistors formed inside of the pixel regions, a technique has been employed in which semiconductor layers of these respective transistors are formed of polycrystalline silicon (p-Si), and the scanning signal driving circuit and the video signal line driving circuit are formed on a surface of one substrate along with the formation of the pixels.

The scanning signal driving circuit is a circuit which mainly uses a shift register, and the video signal line driving circuit also uses a shift register at a portion thereof. However, there has been a recent demand for a shift register which can be operated at high speed at a low voltage and with a low power and which has no through-current. To meet this demand, a shift register which is referred to as dynamic ratio shift register has been proposed, for example.

A dynamic ratio shift register of the type mentioned above has been disclosed in Japanese Patent Publication No. 45638/1987, for example, and the constitution thereof is illustrated in FIG. 9A. Further, FIG. 9B shows a timing chart of the circuit shown in FIG. 9A, which timing chart shows respective outputs VN1 and VN6 at nodes N1 and N6 corresponding to an input pulse φIN and synchronous pulses φ1, φ2.

First of all, when the synchronous pulse φ1 is changed from a Low level (referred to as "L" hereinafter) to a High level (referred to as "H" hereinafter) at the time t1, the input pulse φIN becomes "H", and, hence, the potential VN1 of the node N1 is changed from "L" to "H" through a transistor NMT1.

Assuming the "L" state of the input pulse φIN and the synchronous pulses φ1, φ2 having inverse phases from each other as a ground level (GND), and the "H" state of the input pulse φIN and the synchronous pulses φ1, φ2 as a threshold value Vth of Vφ<NMT1, the potential VN1 at this point of time can be substantially expressed by the following equation (1). Here, Vφ indicates the voltage at the "H" level of the synchronous pulses φ1, φ2 and NMT1 indicates a MOS transistor.

$$VN1 = V\phi - Vth \quad (1)$$

Even when the synchronous pulse φ1 falls from "H" to "L" at the time t2, the input pulse φIN remains at the "H" level, and, hence, the output VN1 holds the voltage expressed by the equation (1). In a strict sense, at a point of time at which the synchronous pulse φ1 falls, the potential becomes lower than the voltage expressed by the equation (1) due to a capacitive coupling between a gate of the transistor NMT1 and the node N1 or the like. However, such a phenomenon is not essential in the explanation of the operation, and, hence, the phenomenon is ignored. Since the transistor NMT1 turns OFF, the node N1 becomes a floating node.

Subsequently, when the synchronous pulse φ2 is changed from "L" to "H" at the time t2, provided that the following equation (2) is satisfied, $$V\phi - Vth \geq V\phi \quad (2)$$

The MOS transistor NMT2 turns ON and the pulse φ2 enters the node N2. At this point of time, due to the coupled capacitance CbI, which is referred to as a bootstrap capacitance that is inserted between the nodes N1 and N2, a voltage rise on a point of the node N2 is transmitted to the node N1 which is in the floating state, so that the potential of the node N2 also rises.

Assuming that the rising potential of the node N2 is ΔVN2, the output VN1 is given by a following equation (3):

$$VN1 = (V\phi - Vth) + \Delta VN2(Cb/Cb(Cb+Cs)) \quad (3)$$

Here, the capacitance Cb includes, besides the capacitance shown in the circuit diagram, such as the preceding coupled capacitance CB1, all of the coupled capacitance of synchronous pulse φ2 and the node N1, which include the capacitance generated' by the gate, the drain and the source of the transistor NMT2, or an inversion layer (channel) formed below the gate, and further include the direct connection capacitance between the wiring of the synchronous pulse φ2 and the node N1. Further, Cs indicates a capacitance obtained by subtracting the above-mentioned bootstrap capacitance Cb from the whole capacitance of the node N1 and constitutes the so-called parasitic capacitance.

Here, provided that the following equation (φ is satisfied at ΔVN2⇒Vφ.

$$(V\phi - Vth) + V\phi(Cb/Cb(Cb+Cs)) > V\phi + Vth \quad (4)$$

This implies that the gate voltage of the MOS transistor NMT2, that is, the output VN1, becomes higher than Vφ+Vth. Accordingly, the output VN2 can be set to the potential of the voltage Vφ. By suitably selecting the capacitance Cb1, which constitutes a design element, it is easy to satisfy the above-mentioned equation (4), and, hence, the output VN2 can be set to the potential of the voltage Vφ.

Here, at the same time, the potential of the node N3 takes a value expressed by a following equation (5) through a MOS transistor NMT3, which is subjected to the diode connection.

$$VN3 = V\phi Vth \quad (5)$$

Since the MOS transistor NMT3 is subjected to diode connection, even when the synchronous pulse $\phi 2$ is changed from "H" to "L" at the time t3, the state expressed by the above equation (5) can be held.

When the synchronous pulse $\phi 1$ is changed from "L" to "H" at the time t3, an operation similar to that expressed by the equation (3) occurs at the node N3 and the MOS transistor NMT 5, so that the outputs VN3, VN4 respectively generate the change of potential as schematically shown in FIG. 1B.

Here, when the nodes N2, N4, N6 are used as output nodes, shift pulses (VN2, VN4, VN6) having a potential equal to that of the "H" level of the synchronous pulse can be obtained, and a dynamic operation which does not generate a through-current can be performed, as apparent from the above-mentioned operations.

However, when the dynamic ratio register having such a constitution is formed by directly providing MIS transistors having semiconductor layers which are made of polycrystalline silicon (p-Si) to surfaces of substrates (glass substrates) which are arranged to face each other in an opposed manner through a liquid crystal, it has been confirmed that the dynamic ratio register operates in an extremely unstable manner, so that a countermeasure to cope with such a phenomenon is needed.

That is, the capacitance, when the floating nodes, such as N1, N3, are at the "L" level, is extremely small, and the other capacitance of the nodes N1, N2, including Cdg1, Cdg2, is, as shown at Cdg1, Cdg2 of FIG. 9A, extremely small compared to the coupled capacitance between the synchronous pulse and the drain gates of the nodes N1, N3. Hence, there exists a high possibility that unselected transistors also will be turned "ON". When the circuit remains as it is, the design and the operational voltage are considerably restricted for holding the "OFF" state.

With respect to a monocrystalline semiconductor at the dynamic ratioless shift register which are made of thin film transistors formed on the glass substrate, the main reasons why the capacitance becomes very small when the floating node is at the "L" level are as follows.

FIG. 10A is a cross-sectional schematic view of an n-type MOS transistor formed on a monocrystalline semiconductor. A semiconductor integrated circuit having a substrate which constitutes the semiconductor is generally used in a form in which it is biased (including the case that it is grounded) for element separation or the like.

Accordingly, as shown in FIG. 10A, through a depletion layer capacitance Csw due to an inverse bias between a source (a diffusion layer) and a well (or a substrate), a depletion layer capacitance Cdw between a drain and the well and a capacitance Cgw between a gate and the well, the source, the drain and the gate are capacitively coupled with the well. Further, the wiring is also capacitively coupled with the substrate or the well which is disposed immediately below the winding with the capacitance Clw through a thick insulation film. These capacitance belong to a group of capacitances which are usually called parasitic capacitances.

Accordingly, at a portion of the node N3 shown in FIG. 9A, a large coupling capacitance with the well can be obtained due to the capacitance Csw of the NMT3 (Csw3), the capacitance Cgw of the NMT6 (Cgw6), the capacitance Cdw (Cdw6), the capacitance Csw of the NMT7 (Csw7) and the capacitance Clw (Clw3) of the wiring which constitutes this node.

Further, by making the bootstrap capacitance have the enhanced MOS capacitive constitution which is shown in FIG. 10B and FIG. 10C, the well is capacitively coupled with an inversion layer that extends from a depletion layer which constitutes a separate node at the "ON" time, as shown in FIG. 10B so that an efficient bootstrap effect (a boosting effect) is obtained, while a coupled capacitance Cb1(w) with the well is obtained at the "OFF" time, as shown in FIG. 10B.

Accordingly, when the node N3 is at the "L" level, even when the node N3 is floating on the circuit shown in FIG. 9A, the large capacitance can be ensured with the bias of the well through the above-mentioned coupled capacitance. With respect to the capacitance, the sum of Cdw of the NMT3 (Cdw1) and the space capacitance C1 $\phi 1$ between the wiring of $\phi 1$ and the node N3 is sufficiently small, and, hence, the potential difference $\Delta VN3$ of the node N3 when the wiring $\phi 1$ is changed from "L" to "H" is substantially expressed by the following equation (6).

$$\Delta VN3 = V\phi \times (Cdw + C1\phi 1)/(Cdw1|C1\phi 2 + Csw3 + Cgw6 + Cdw6 + Csw7 + Cb1(w)) \quad (6)$$

Further, as explained above, since the relationship expressed by the following equation (7) is established, $$Cdw1 + C1\phi 2 << Csw3 + Cgw6 + Cdw6 + Csw1 + Cb1(w) \quad (7)$$

it becomes easy to satisfy the following equation (8).

$$\Delta VN3 < Vth \quad (8)$$

However, when a similar circuit made of monocrystalline thin film transistors is formed on a glass substrate, the above-mentioned operation is not achieved.

FIG. 10D is a cross-sectional schematic view of the monocrystalline thin film transistor which is formed on the glass substrate. Provided that the substrate is formed of an insulating body, once a p layer arranged below a source, a drain or a gate becomes floating, the capacitance which can be coupled becomes the depletion layer capacitance Cdp, Csp between the source, or drain or the gate and the p layer arranged below the source, the drain or the gate or the small space capacitance Cs1, Cp1, Cd1 between the p layer and the wiring which is disposed so as to be remote from the source, drain or the gate. To take a portion of the node N3 of the circuit shown in FIG. 9A as an example, in the same manner as the above-mentioned example, the node N3 is capacitively coupled with the node N2 through the source Csp3 of the MOS transistor NMT3. Since the node N2 is also floating, the path is divided into a path which brings about the capacitive coupling with the node N1 through the capacitance Cb1 and a path which brings about the capacitive coupling with the synchronous pulse $\phi 2$ through the SP2 of the MOS transistor NMT2. Since the node N1 is also floating, the path is divided into a path which brings about the capacitive coupling with the input pulse $\phi$IN through the capacitance Csp1 of the MOS transistor NMT1 and a path which brings about the capacitive coupling with the ground potential Vss through the capacitance Csp4 of the MOS transistor NMT4, which brings about the capacitive coupling with the synchronous pulse $\phi 1$ through the capacitance Csg1 of the MOS transistor NMT1.

That is, both capacitances also become very small and the coupling with the synchronous pulse $\phi 1$ functions in such a manner that the output VN3 is boosted when the synchronous pulse $\phi 1$ becomes "L"⇒"H".

Although the source of a MOS transistor NMT7 is capacitively coupled with the ground potential VSS through the capacitance Csp7, this is also not significant. Further, the node N3 is capacitively coupled with the node N4 through the capacitance Cb2 so that the node N4 is also floating. The wiring which constitutes the node N3 does not have the capacitance immediately below the node N3, and the node N3 has only a weak capacitive coupling with any one of the wirings through the space capacitance.

The node N3 is capacitively coupled with the synchronous pulse φ1 through the capacitance Cdg5 of the MOS transistor NMT5. This capacitive coupling is the direct capacitive coupling with the outside and is relatively large. This capacitance becomes a cause of instability.

Assuming the total sum of the above-mentioned other secondary coupled capacitance of the node N3, except for the capacitance Cdg5 as the capacitance CN3, the change of potential AWN3 of the node N3 when the synchronous pulse φ1 is changed from "L"⇒"H" is substantially expressed by a following equation (9). Since the capacitance CN3 is not so large as mentioned above, depending on values of the voltage Vφ and the capacitance Cdg5 (W size design of the MOS transistor NMT5 or the wiring layout of the synchronous pulse φ1), conditions shown by the following equation (10) are easily brought about.

$$\Delta VN3 = V\phi \times (Cdg5/(Cdg5+CN3)) \qquad (9)$$

$$\Delta VN3 \geq Vth \qquad (10)$$

Once the conditions indicated by the above equation (10) are satisfied, the capacitance Cgp of the MOS transistor NMT5 (the capacitance with the inversion layer) and the bootstrap capacitance Cb2 are changed to the coupled capacitance with the node N3 and the φ1 in an opposed manner, so that the possibility that the MOS transistor NMT3 turns completely "ON" due to the bootstrap effect is extremely increased. That is, an unstable operation is generated such that nodes which are irrelevant to the node under control become "H" and generate outputs or start the scanning from such portions.

The present invention has been made in view of such a circumstance, and it is an object of the present invention to provide a display device having a dynamic ratioless shift register which ensures stable operation and which can increase the degree of freedom of design.

SUMMARY OF THE INVENTION

A summary of typical features and aspects of the invention disclosed in the present application are as follows.
Aspect 1.

The display device according to the present invention is, for example, characterized in that the display device is provided with a driving circuit which includes a shift register on a surface of a substrate, and the shift register is constituted of MISTFTs which use polycrystalline silicon as a semiconductor layer. The first terminal of the first MISTFT is connected to receive an input pulse, and a gate terminal of the first MISTFT is connected to receive a first synchronous pulse, thus forming an inputting part. The second terminal of the first MISTFT is connected to a gate terminal of the second MISTFT and the first terminal of the fourth MISTFT, and, further, it is connected to the first terminal of the first capacitance element. The second terminal of the first capacitance is connected to a fixed voltage and the first terminal of the second MISTFT is connected to receive a second synchronous pulse which has an inverse phase with respect to the first synchronous pulse. The second terminal of the second MISTFT is connected to the first terminal and a gate terminal of the third MISTFT, and it is further connected to the first terminal of the second capacitance. The second terminal of the second capacitance is connected to the second terminal of the first MISTFT, the gate terminal of the second MISTFT and the first terminal of the fourth MISTFT. The second terminal of the third MISTFT is connected to a gate terminal of the fifth MISTFT and the first terminal of the seventh MISTFT, and it is further connected to the first terminal of the third capacitance element, thus forming a first output terminal. The second terminal of the third capacitance is connected to receive a fixed voltage and the first terminal of the fifth MISTFT is connected to the first synchronous pulse. The second terminal of the fifth MISTFT is connected to the first terminal and a gate terminal of the sixth MISTFT and a gate terminal of the fourth MISTFT, and it is further connected to the first terminal of the fourth capacitance to form a second output terminal. The second terminal of the fourth capacitance is connected to the second terminal of the third MISTFT, the gate terminal of the fifth MISTFT and the first terminal of the seventh MISTFT. The second terminal of the fourth MISTFT and the second terminal of the seventh MISTFT are connected to a fixed power source or a ground potential which is equal to the voltage which will be the source voltage of the MISTFT which is included among the voltages of the first and second synchronous pulses, or which will be the source voltage of first and second synchronous pulses which is not less than the threshold voltage of the fourth MISTFT, wherein a pulse which is shifted by one clock and corresponds to a pulse inputted to the gate terminal of the fourth MISTFT is inputted to the gate terminal of the seventh MISTFT.

In the display device having such a constitution as describe above, one side of the load capacitance is connected to a node which can be floating and the other side of the load capacitance is connected to the fixed potential or the like. Accordingly, the design tolerance in a state in which the above-mentioned unstable elements are eliminated can be broadened so that a stable dynamic ratioless shift register including thin film transistors made of polycrystalline silicon can be realized.
Aspect 2.

The display device according to the present invention is characterized in that, for example, on the premise of the constitution of the aspect 1, n basic circuits, each of which is constituted of the second to seventh MISTFTs and first to fourth capacitances are connected in multi-stages. The gate terminal of the MISTFT which corresponds to the second MISTFT of the ith basic circuit is connected to the second terminal of the MISTFT corresponding to the sixth MISTFT of the (i−1)th basic circuit. The gate terminal of the MISTFT which corresponds to the seventh MISTFT of the ith basic circuit is connected to the second terminal of the MISTFT corresponding to the second MISTFT of the (i+1)th basic circuit. The pulse which corresponds to the pulse inputted to the gate terminal of the fourth MISTFT of the basic circuit of a next stage and is shifted by one clock is inputted to the gate terminal of the MISTFT which corresponds to the seventh MISTFT of the nth basic circuit.
Aspect 3.

The display device according to the present invention is characterized in that, for example, on the premise of the constitution of the aspect 2, the second MISTFT is incorporated into the first basic circuit, and the first MISTFT and the second MISTFT are incorporated into each one of the second and succeeding basic circuits. The first MISTFT has the gate terminal thereof connected to the input terminal for receipt of the input pulse, the first terminal thereof connected to the gate terminal of the MISTFT corresponding to the second MISTFT, and the second terminal thereof connected to a fixed power source or a ground potential which is equal to the voltage which will be the source voltage of the MISTFT, which is included among the voltages of the first and second synchronous pulses, or which will be the source voltage of first and second synchronous pulses, which is not less than the threshold voltage of the fourth MISTFT. The second MISTFT has the gate terminal thereof connected to the input terminal of the input pulse, the first terminal thereof connected to the gate terminal the fifth MISTFT or the gate terminal of a MISTFT corresponding to the fifth MISTFT, and the second terminal thereof connected to a fixed power source or a ground potential, which is equal to a voltage which becomes a source voltage of the MISTFT out of the voltages of the first and second synchronous pulses, or which is not different from the voltage which becomes the source voltage of the first or second synchronous pulse to an extent that the fixed power source or the ground potential at least does not exceed a threshold value voltage of the fourth MISTFT.

Aspect 4.

The display device according to the present invention is, for example, characterized in that the display device is provided with a driving circuit which includes a shift register on a surface of a substrate, and the shift register is constituted of MISTFTs which use polycrystalline silicon as a semiconductor layer. The first terminal and a gate terminal of the first MISTFT are connected to receive an input pulse, thus forming an inputting part. The second terminal of the first MISTFT is connected to a gate terminal of the second MISTFT and the first terminal of the fourth MISTFT, and, further, it is connected to a first terminal of a first capacitance element. The second terminal of the first capacitance element is connected to a fixed voltage and the first terminal of the second MISTFT is connected to receive a second synchronous pulse which has an inverse phase with respect to the first synchronous pulse. The second terminal of the second MISTFT is connected to the first terminal and a gate terminal of the third MISTFT, and is it further connected to a first terminal of a second capacitance. The second terminal of the second capacitance is connected to the second terminal of the first MISTFT, the gate terminal of the second MISTFT and the first terminal of the fourth MISTFT. The second terminal of the third MISTFT is connected to a gate terminal of the fifth MISTFT and the first terminal of the seventh MISTFT, and it is further connected to the first terminal of the third capacitance element, thus forming a first output terminal. The second terminal of the third capacitance is connected to a fixed voltage and the first terminal of the fifth MISTFT is connected to the first synchronous pulse. The second terminal of the fifth MISTFT is connected to the first terminal and a gate terminal of the sixth MISTFT and a gate terminal of the fourth MISTFT, and it is further connected to the first terminal of the fourth capacitance to form the second output terminal. The second terminal of the fourth capacitance is connected to the second terminal of the third MISTFT, the gate terminal of the fifth MISTFT and the first terminal of the seventh MISTFT. The second terminal of the fourth MISTFT and the second terminal of the seventh MISTFT are connected to a fixed power source or a ground potential, which is equal to the voltage which will be the source voltage of the MISTFT, which is included among the voltages of the first and second synchronous pulses, or which will be the source voltage of first and second synchronous pulses which is not less than the threshold voltage of the fourth MISTFT, wherein a pulse which is shifted by one clock and corresponds to a pulse inputted to the gate terminal of the fourth MISTFT is inputted to the gate terminal of the seventh MISTFT.

Aspect 5.

The display device according to the present invention is characterized in that, for example, on the premise of the constitution of the aspect 4, n basic circuits, each of which is constituted of the second to seventh MISTFT5 and first to fourth capacitance, are connected in multi-stages. The gate terminal of the MISTFT, which corresponds to the second MISTFT of the ith basic circuit, is connected to the second terminal of the MISTFT corresponding to the sixth MISTFT of the (i−1)th basic circuit. The gate terminal of the MISTFT, which corresponds to the seventh MISTFT of the ith basic circuit, is connected to the second terminal of the MISTFT corresponding to the second MISTFT of the (i+1)th basic circuit. The pulse which corresponds to the pulse inputted to the gate terminal of the fourth MISTFT of the basic circuit of a next stage and is shifted by one clock is inputted to the gate terminal of the MISTFT which corresponds to the seventh MISTFT of the nth basic circuit.

Aspect 6.

The display device according to the present invention is characterized in that, for example, on the premise of the aspect 5, the second MISTFT is incorporated into the first basic circuit, and the first MISTFT and the second MISTFT are incorporated into each one of the second and succeeding basic circuits. The first MISTFT has the gate terminal thereof connected to the input terminal of the input pulse, the first terminal thereof connected to the gate terminal of the MISTFT corresponding to the second MISTFT, and the second terminal thereof connected to a fixed power source or a ground potential which is equal to the voltage which will be the source voltage of the MISTFT, which is included among the voltages of the first and second synchronous pulses, or which will be the source voltage of first and second synchronous pulses which is not less than the threshold voltage of the fourth MISTFT. The second MISTFT has the gate terminal thereof connected to the input terminal of the input pulse, the first terminal thereof connected to the gate terminal of the fifth MISTFT or the gate terminal of a MISTFT corresponding to the fifth MISTFT, and the second terminal thereof connected to a fixed power source or a ground potential which is equal to the voltage which will be the source voltage of the MISTFT, which is included among the voltages of the first and second synchronous pulses, or which will be the source voltage of first and second synchronous pulses which is not less than the threshold voltage of the fourth MISTFT.

Aspect 7.

The display device according to the present invention is, for example, characterized in that the display device is provided with a driving circuit which includes a shift register on a surface of a substrate, and the shift register is constituted of MISTFTs which use polycrystalline silicon as a semiconductor layer. The first terminal and a gate terminal of the first MISTFT are connected to an input pulse thus forming an inputting part. The second terminal of the first MISTFT is connected to a gate terminal of the second MISTFT and the first terminal of the fourth MISTFT, and, further, it is connected to a fixed voltage through the first capacitance. The first terminal of the second MISTFT is connected to the second synchronous pulse which has an inverse phase with respect to the first synchronous pulse. The second terminal of the second MISTFT is connected to the first terminal and a gate terminal of the third MISTFT, and it is further connected to the second terminal of the first MISTFT, the gate terminal of the second MISTFT and the first terminal of the fourth MISTFT. The second terminal of the third MISTFT is connected to a gate terminal of the fifth MISTFT and the first terminal of the seventh MISTFT, and it is further connected to the fixed voltage through the third capacitance element. The first terminal of the fifth MISTFT is connected to the first synchronous pulse. The first terminal of the fifth MISTFT is connected to the first terminal and a gate terminal of the sixth MISTFT and a gate terminal of the fourth MISTFT, and it is further connected to the second terminal of third MISTFT, the gate terminal of the fifth MISTFT and the first terminal of the seventh MISTFT through the fourth capacitance element. The second terminal of the fourth MISTFT is connected to a fixed power source or a ground potential, which is equal to the voltage which will be the source voltage of the MISTFT, which is included among the voltages of the first and second synchronous pulses, or which will be the source voltage of first and second synchronous pulses which is not less than the threshold voltage of the fourth MISTFT. wherein a pulse which is shifted by one clock and corresponds to a pulse inputted to the gate terminal of the fourth MISTFT is inputted to the gate terminal of the seventh MISTFT.

Aspect 8.

The display device according to the present invention is characterized in that, for example, on the premise of the constitution of the aspect 7, n basic circuits, each of which is constituted of the second to eleventh MISTFT5 and the first and second capacitances are connected in multi-stages. The gate terminal of the MISTFT, which corresponds to the second MISTFT of the ith basic circuit, is connected to the second terminal of the MISTFT corresponding to the tenth MISTFT of the (i−i)th basic circuit. The gate terminal of the MISTFT which corresponds to the eighth MISTFT and the first terminal of the MISTFT which corresponds to the seventh MISTFT of the ith basic circuit are connected to the second terminal of the MISTFT corresponding to the sixth MISTFT of the (i+i)th basic circuit. The pulse which corresponds to the pulse inputted to the gate terminal of the fourth MISTFT and is shifted by one clock is inputted to the gate terminal of the MISTFT which corresponds to the eighth MISTFT and the first terminal of the MISTFT which corresponds to the seventh MISTFT of the nth basic circuit.

Aspect 9.

The display device according to the present invention is, for example, characterized in that the display device is provided with a driving circuit which includes a shift register on a surface of a substrate, and the shift register is constituted of MISTFTS which use polycrystalliñe silicon as a semiconductor layer. The first terminal of the first MISTFT is connected to an input pulse, and a gate terminal of the first MISTFT is connected to the first synchronous pulse, thus forming an inputting part. The second terminal of the first MISTFT is connected to a gate terminal of the fourth MISTFT and the first terminal of the third MISTFT, and, further, it is connected to the first terminal of the first capacitance. The second terminal of the first capacitance is connected to the second terminal of the fourth MISTFT, the first terminal and a gate terminal of the fifth MISTFT and the first terminal and a gate terminal of the sixth MISTFT, and it is further connected to a gate terminal of the seventh MISTFT, a gate terminal of the second MISTFT is connected to the input pulse, and the first terminal of the second MISTFT is connected to the second terminal of the eleventh MISTFT and a gate terminal of the third MISTFT. The second terminal of the second MISTFT and the second terminal of the seventh MISTFT are connected to a fixed power source or a ground potential, which is equal to the voltage which will be the source voltage of the MISTFT, which is included among the voltages of the first and second synchronous pulses, or which will be the source voltage of first and second synchronous pulses which is not less than the threshold voltage of the fourth MISTFT. The second terminal of the third MISTFT is connected to a fixed power source or a ground potential, which is equal to the voltage which will be the source voltage of the MISTFT, which is included among the voltages of the first and second synchronous pulses, or which will be the source voltage of first and second synchronous pulses which is not less than the threshold voltage of the fourth MISTFT. The first terminal of the fourth MISTFT is connected to the second synchronous pulse, and the second terminal of the fifth MISTFT is connected to a gate terminal of the ninth MISTFT and the first terminal of the eighth MISTFT. The second terminal of the second capacitance is connected to the second terminal of the ninth MISTFT, the first terminal and a gate terminal of the tenth MISTFT and the first terminal and a gate terminal of the eleventh MISTFT, and, further it is connected to the first terminal of the second capacitance element, thus forming the first output terminal. The first terminal of the seventh MISTFT is connected to the gate terminal of the eighth MISTFT, and the second terminal of the eighth MISTFT is connected to a fixed power source or a ground potential, which is equal to the voltage which will be the source voltage of the MISTFT, which is included among the voltages of the first and second synchronous pulses, or which will be the source voltage of first and second synchronous pulses which is not less than the threshold voltage of the fourth MISTFT. The first terminal of the ninth MISTFT is connected to the first synchronous pulse, wherein a pulse which is shifted by one clock and corresponds to a pulse inputted to the gate terminal of the fourth MISTFT is inputted to the gate terminal of the eighth MISTFT and the first terminal of the seventh MISTFT.

Aspect 10.

The display device according to the present invention is characterized that, for example, on the premise of the constitution of the aspect 9, n basic circuits, each of which is constituted of the second, third, fourth, fifth, seventh, eighth, ninth and tenth MISTFTS and the first and second capacitance, are connected in multi-stages. The second terminal of a MISTFT which corresponds to the tenth MISTFT of the ith basic circuit is connected to the gate terminal of the MISTFT corresponding to the fourth MISTFT of the (i−i)th basic circuit. The second terminal of the MISTFT which corresponds to the seventh MISTFT and the gate terminal of the MISTFT which corresponds to the third MISTFT of the ith basic circuit are connected to the capacitance corresponding to the first capacitance of the (i+i)th basic circuit through the sixth MISTFT. The second terminal of the sixth MISTFT is connected to the second terminal of the MISTFT and the gate terminal of the MISTFT which corresponds to the third MISTFT and the first terminal and the gate terminal of the sixth MISTFT is connected to the capacitance.

Aspect 11.

The display device according to the present invention is characterized in that, for example, at respective basic circuits starting from a second basic circuit, the second terminal of first MISTFT, which has the first terminal thereof and a gate terminal thereof connected to an input pulse, is connected to the second terminal of a MISTFT which corresponds to an eleventh MISTFT. At respective basic circuits starting from a third basic circuit, the second terminal of the second MISTFT, which has the first terminal thereof and a gate terminal thereof connected to an input pulse, is connected to a gate terminal of a MISTFT which corresponds to the eighth MISTFT of the basic circuit, which forms a pre-stage of the subject basic circuit, and is connected to the second terminal of capacitance which corresponds to the first capacitance through the MISTFT. The second terminal of the MISTFT is connected to the second terminal of the second MISTFT, and the first terminal and the gate terminal are connected to the capacitance.

Aspect 12.

The display device according to the present invention is, for example, characterized in that the display device is provided with a driving circuit which includes a shift register on a surface of a substrate, and the shift register is constituted of MISTFTs which use polycrystalline silicon as a semiconductor layer. The first terminal and a gate terminal of the first MISTFT are connected to receive an input pulse, thus forming an input part. The second terminal of the first MISTFT is connected to a gate terminal of the fourth MISTFT and the first terminal of the third MISTFT, and, further it is connected to the first terminal of the first capacitance. The second terminal of the first capacitance is connected to the second terminal of the fourth MISTFT, the first terminal and a gate terminal of the fifth MISTFT and the first terminal and a gate terminal of the sixth MISTFT, and it is further connected to a gate terminal of the seventh MISTFT. A gate terminal of the second MISTFT is connected to the input pulse, and the first terminal of the second MISTFT is connected to the second terminal of the eleventh MISTFT and a gate terminal of the third MISTFT. The second terminal of the second MISTFT and the second terminal of the seventh MISTFT are connected to a fixed power source or a ground potential, which is equal to the voltage which will be the source voltage of the MISTFT, which is included among the voltages of the first and second synchronous pulses, or which will be the source voltage of first and second synchronous pulses which is not less than the threshold voltage of the fourth MISTFT. The second terminal of the third MISTFT is connected to a fixed power source or a ground potential, which is equal to the voltage which will be the source voltage of the MISTFT, which is included among the voltages of the first and second synchronous pulses, or which will be the source voltage of first and second synchronous pulses which is not less than the threshold voltage of the fourth MISTFT.

The first terminal of the fourth MISTFT is connected to the second synchronous pulse, and the second terminal of the fifth MISTFT is connected to a gate terminal of the ninth MISTFT and the first terminal of the eighth MISTFT. The second terminal of the second capacitance is connected to the second terminal of the ninth MISTFT, the first terminal and a gate terminal of the tenth MISTFT and the first terminal and a gate terminal of the eleventh MISTFT, and, further it is connected to the first terminal of the second capacitance element thus, forming the first output terminal. The first terminal of the seventh MISTFT is connected to the gate terminal of the eighth MISTFT, and the second terminal of the eighth MISTFT is connected to a fixed power source or a ground potential, which is equal to the voltage which will be the source voltage of the MISTFT, which is included among the voltages of the first and second synchronous pulses, or which will be the source voltage of first and second synchronous pulses, which is not less than the threshold voltage of the fourth .MISTFT. The first terminal of the ninth MISTFT is connected to the first synchronous pulse, wherein a pulse which is shifted by one clock and corresponds to a pulse inputted to the gate terminal of the fourth MISTFT is inputted to the gate terminal of the eighth MISTFT and the first terminal of the seventh MISTFT.

Aspect 13.

The display device according to the present invention is characterized in that, for example, on the premise of the constitution of the aspect 12, n basic circuits, each of which is constituted of the second, third, fourth, fifth, seventh, eighth, ninth and tenth MISTFTs and the first and second capacitances are connected in multi-stages. The second terminal of the MISTFT, which corresponds to the tenth MISTFT of the ith basic circuit, is connected to the gate terminal of the MISTFT corresponding to the fourth MISTFT of the (i−I)th basic circuit. The second terminal of the MISTFT which corresponds to the seventh MISTFT and the gate terminal of the MISTFT which corresponds to the third MISTFT of the ith basic circuit are connected to the capacitance corresponding to the first capacitance of the (i+1)th basic circuit through the sixth MISTFT. The second terminal of the sixth MISTFT is connected to the second terminal of the MISTFT and the gate terminal of the MISTFT which corresponds to the third MISTFT and the first terminal and the gate terminal of the sixth MISTFT are connected to the capacitance.

Aspect 14.

The display device according to the present invention is characterized in that, on the premise of the aspect 13, at respective basic circuits starting from the second basic circuit, the second terminal of the first MISTFT, which has the first terminal thereof and a gate terminal thereof connected to an input pulse, is connected to the second terminal of a MISTFT which corresponds to the eleventh MISTFT. At respective basic circuits starting from the third basic circuit, the second terminal of the second MISTFT, which has the first terminal thereof and a gate terminal thereof connected to an input pulse, is connected to a gate terminal of a MISTFT which corresponds to the eighth MISTFT of a basic circuit, which forms a pre-stage of the subject basic circuit, and is connected to the second terminal of capacitance which corresponds to the first capacitance through the MISTFT. The second terminal of the MISTFT is connected to the second terminal of the second MISTFT and the first terminal and the gate terminal are connected to the capacitance.

Aspect 15.

The display device according to the present invention is, for example, provided with a ratioless dynamic shift' register which includes multi-staged inverters on a substrate surface. The ratioless dynamic shift register is constituted of MISTFTs which use polycrystalline silicon as a semiconductor layer. Separate MISTFTs are connected in parallel to MISTFTs which are connected to ground levels of outputs of respective stages, and the separate MISTFTs are constituted such that each output is dropped to a ground level during a period other than a period in which a signal of High level is transmitted as an input signal of an inverter at a stage preceding to a stage which is constituted of the MISTFTs.

Aspect 16.

The display device according to the present invention is, on the premise of the constitution of the aspect 15, characterized in that the separate MISTFTs are operated by inputting outputs of the next stage, and each output is dropped to the ground level during the period other than the period in which the signal of High level is transmitted as the input signal of the inverter at the stage preceding to the stage which is constituted of the MISTFT.

Aspect 17.

The display device according to the present invention is, for example, on the premise of the constitution of the Aspect 15, characterized in that the separate MISTFT is operated by inputting a clock pulse, and each output is dropped to the ground level during the period other than the period in which the signal of High level is transmitted as the input signal of the inverter at the stage preceding to the stage which is constituted of the MISTFT.

Aspect 18.

The display device according to the present invention is, for example, characterized in that the display device is provided with a display driving circuit including a ratioless dynamic shift register which is comprised of multi-staged inverters on a substrate surface. The ratioless dynamic shift register is constituted of MISTFTs which use polycrystalline silicon as a semiconductor layer, and the first MISTFT, and the second MISTFT which are connected in parallel to each other, are provided as MISTFTs which are connected to the ground levels of respective outputs of respective stages. Either one of the first MISTFT and the second MISTFT is constituted such that each output is dropped to the ground level during the period other than the period in which the signal of High level is transmitted as the input signal of the inverter at the stage preceding to the stage which is constituted of the MISTFT. A diode which constitutes the third MISTFT is provided between a gate of either one of the first MISTFT and the second MISTFT and a node to which a clock is supplied through a diode, such that a charge which is charged to the gate is prevented from leakage to the node as an inverse current flow of the diode which is caused by the lowering of the potential of the node below the ground level.

Aspect 19.

The display device according to the present invention is, for example, characterized in that the display device is provided with a display driving circuit including a ratioless dynamic shift register which is comprised of multi-staged inverters on a substrate surface. The ratioless dynamic shift register is constituted of MISTFT5 which use polycrystalline silicon as a semiconductor layer, and a first MISTFT and a second MISTFT are provided, which drop respective outputs of respective stages to a ground level when the first clock and the second clock are in the "ON" state and the third MISTFT and the fourth MISTFT which become the "ON" state when the outputs are at the "High" level and turn off the first MISTFT and the second MISTFT.

Aspect 20.

The display device according to the present invention is, for example, on the premise of the constitution of the Aspect 19, characterized in that the first clock is inputted to the gate of the first MISTFT through the first capacitance element, the second clock is inputted to the gate of the second MISTFT through the second capacitance element, and the fifth MISTFT and the sixth MISTFT which are respectively subjected to the diode connection are provided between the gate of the first MISTFT and the ground level and between the gate of the second MISTFT and the ground level.

Aspect 21.

The display device according to the present invention is, for example, characterized in that the display device is provided with a display driving circuit including a ratioless dynamic shift register which is comprised of multi-staged inverters on a substrate surface. The ratioless dynamic shift register is constituted of MISTFTS which use polycrystalline silicon as a semiconductor layer. A first MISTFT is provided, which is connected to ground levels of respective outputs of respective stages, and a second MISTFT is provided, which is operated with an output of a preceding stage and has one end thereof connected to a ground level and the other end thereof connected to a clock through the first capacitance element and further has the other end thereof connected to a gate of the first MISTFT. A second capacitance element is disposed between the other end of the second MISTFT and the ground level.

Aspect 22.

The display device according to the present invention is, for example, on the premise of the Aspect 21, characterized in that the second capacitance element has a capacitance larger than a gate-drain capacitance of the second MISTFT.

DETAILED DESCRIPTION OF THE PREFERRED EMBODIMENTS

Preferred embodiments of a display device according to a present invention will be explained in conjunction with accompanying drawings.

<<Overall Constitution>>

Figure 2:
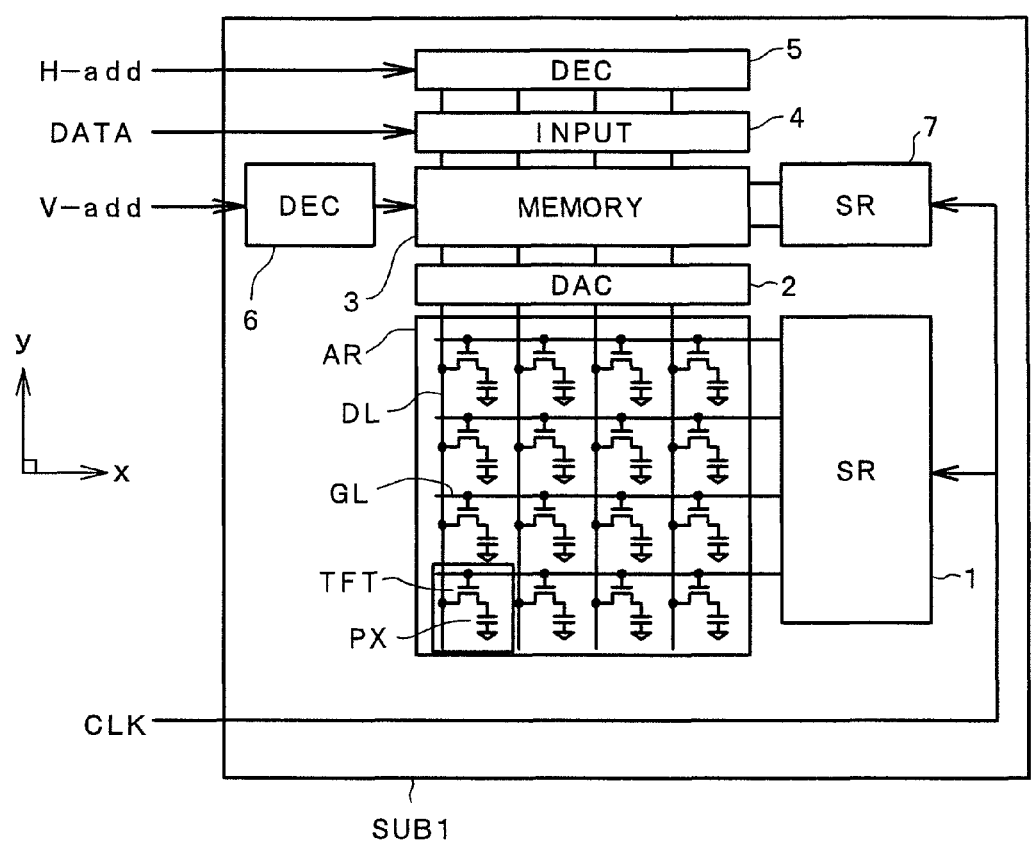
FIG. 2 is a schematic diagram of one embodiment showing the overall configuration of the display device according to the present invention.

FIG. 2 is a schematic diagram showing the overall configuration of a liquid crystal display device according to the present invention. This drawing constitutes a plan view which is drawn corresponding to an actual geometrical arrangement.

In the drawing, for example, a transparent substrate SUB1, which is formed of a glass substrate, constitutes one of a pair of transparent substrates that are arranged to face each other in an opposed manner through a liquid crystal. On a central portion (display portion AR), excluding the periphery of the liquid-crystal-side surface of the transparent substrate SUB1, gate signal lines GL, which extend in the x direction and are arranged in the y direction in the drawing, and drain signal lines DL, which extend in the y direction and are arranged in the x direction in the drawing, are formed.

Each region, which is surrounded by neighboring gate signal lines GL and the neighboring drain signal lines DL, define a pixel region. The pixel region is provided with a thin film transistor TFT, which is operated upon receiving scanning signals from the gate signal line GL at one side and a pixel electrode PX to which video signals are supplied from the drain signal line DL at one side through the thin film transistor TFT. That is, scanning signals (voltages) are sequentially supplied to the respective gate signal lines GL from the top to the bottom in the drawing, for example, and the thin film transistors TFT are turned ON in response to these scanning signals. In synchronism with this timing, video signals (voltages) are supplied from the respective drain signal lines DL, and these video signals are applied to the pixel electrodes PX through those thin film transistors TFT that are in the ON state.

These respective pixel electrodes PX generate an electric field between the pixel electrodes PX and a counter electrode (not shown in the drawing) which is commonly formed at respective pixel regions on a liquid crystal side surface of other transparent substrate, which is arranged to face the transparent substrate SUB1 in an opposed manner, for example. The light transmittivity of the liquid crystal is controlled by this electric field.

The respective gate signal lines GL have one end thereof (left side in the drawing) connected to a pixel driving shift register 1, and the scanning signals are sequentially supplied to respective gate signals lines GL by the pixel driving shift register 1. The respective drain signal lines DL have one end (upper side in the drawing) connected sequentially to a D-A conversion circuit 2. a memory 3, an input data entry circuit 4 and an H-side address decoder 5, while a V-side address decoder 6 and a memory driving shift register 7 are connected to the memory 3.

To the liquid crystal display device having such a constitution, information including a start pulse clock signal, pixel data, a pixel address (H) and a pixel address (V) are inputted. The start pulse clock signal is inputted to the memory driving shift register 7 and the pixel driving shift register 1. The pixel address (H) is inputted to the H-side address decoder 5. The pixel data is inputted to the input data entry circuit 4. The pixel address (V) is inputted to the V-side address decoder 6.

Here, at a display part AR, which is formed on a surface of the transparent substrate SUB1, and at respective circuits arranged around the display part AR, the thin film transistors (MISTFT) which are formed by laminating conductive layers, semiconductor layers, insulation layers and the like, and the pixel electrodes, the signal lines and the like, which are formed into a given pattern by an selective etching using a photolithography technique, are provided.

In this case, the semiconductor layer is formed of polycrystalline silicon (P-Si), for example.

<<Pixel Driving Shift Register>>

Figure 1A:
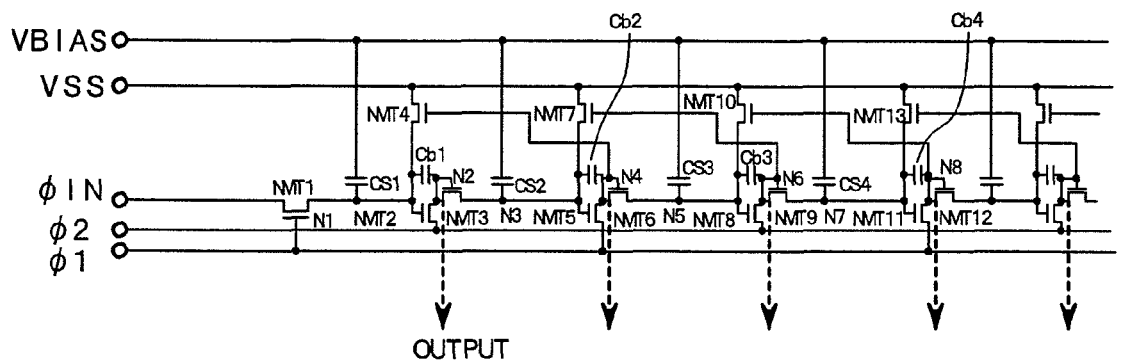
FIG. 1A is a schematic circuit diagram and FIG. 1B is a timing chart of one embodiment of a shift register formed on a substrate of a display device according to the present invention.
Figure 1B:
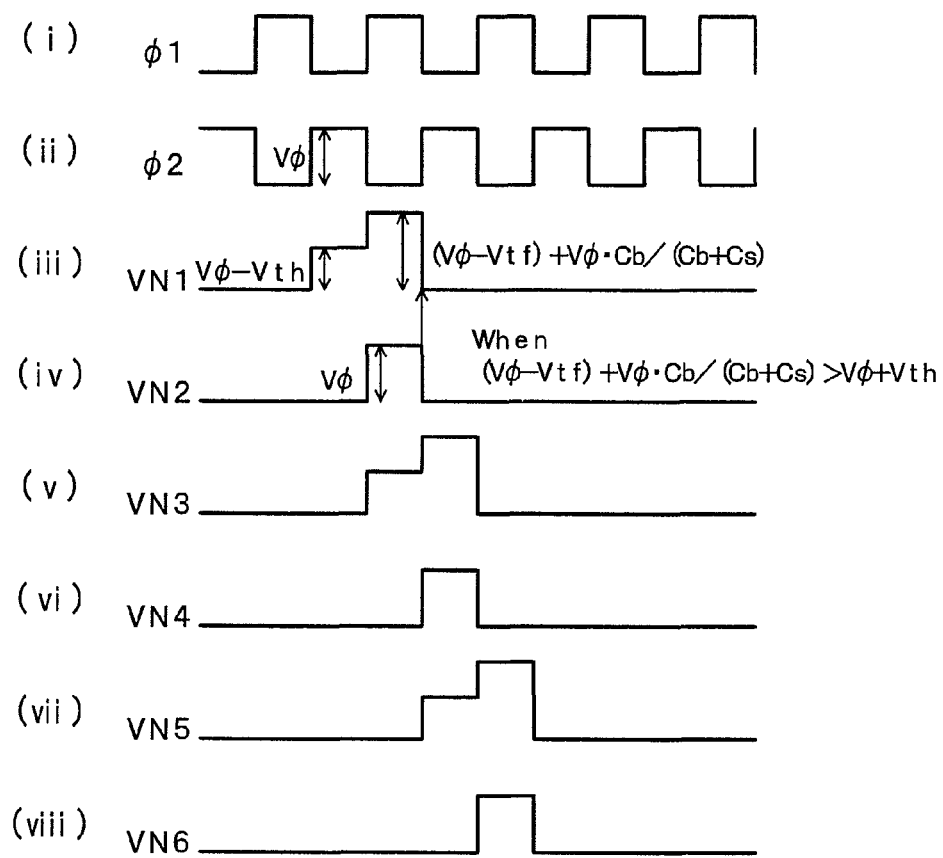

FIG. 1A is a circuit diagram showing one embodiment of the pixel driving shift register. Further, FIG. 1B is a timing chart for the circuit shown in FIG. 1A, showing outputs VN1 to VN6 respectively corresponding to nodes N1 to N6 with respect to an input pulse $\phi$IN and synchronous pulses $\phi 1$, $\phi 2$.

In FIG. 1A, first of all, an n-type MOS transistor NMT1 is provided. Of the source and drain terminals, one terminal is connected to an input terminal (PIN of the input pulse $\phi$IN, and the gate terminal is connected to an input terminal of the synchronous pulse $\phi 1$. This MOS transistor NNT1 constitutes an inputting part.

The other terminal of the MOS transistor NMT1 is connected to a gate terminal of an n-type MOS transistor NMT2, one terminal of an n-type MOS transistor NMT4 and one terminal of a capacitance element CS1. The other terminal of the capacitance element CS1 is connected to a fixed voltage VBIAS, and one terminal of the MOS transistor NMT2 is connected to an input terminal of the synchronous pulse $\phi 2$ which forms an inverse phase with respect to the previously mentioned synchronous pulse $\phi 1$.

The other terminal of the MOS transistor NMT2 is connected to one terminal of the n-type MOS transistor NMT3 and the gate terminal, and it is further connected to one terminal of the capacitance element Cb1. The other terminal of the capacitance element Cb1 is connected to the other terminal of the MOS transistor NMT1, the gate terminal of the MOS transistor NMT2 and one terminal of the n-type MOS transistor NNT4.

The other terminal of the MOS transistor NMT3 is connected to a gate terminal of an n-type MOS transistor NMT5 and one terminal of a MOS transistor NMT7. Further, the other terminal of the MOS transistor NMT3 is connected to one terminal of the capacitance element CS2. The other terminal of the MOS transistor NMT3 constitutes the first output terminal. The other terminal of the capacitance element CS2 is connected to a fixed voltage VBIAS, and one terminal of the MOS transistor NMT5 is connected to an input terminal of the synchronous pulse $\phi 1$.

The other terminal of the MOS transistor NMT5 is connected to one terminal and a gate terminal of an n-type MOS transistor NMT6 and a gate terminal of the MOS transistor NMT4. The other terminal of the MOS transistor NMT5 is further connected to one terminal of the capacitance element Cb2. The other terminal of the MOS transistor NMT5 constitutes the second output terminal. The other terminal of the capacitance element Cb2 is connected to the other input terminal of the MOS transistor NMT3, the gate terminal of the MOS transistor NMT5 and one terminal of the n-type MOS transistor NMT7.

The other terminal of the MOS transistor NMT4 and the other terminal of the MOS transistor NMT7 are connected to a fixed power source or a ground potential (VSS/VDD) which is equal to a voltage, which becomes a source voltage of the MOS transistor out of the voltages of the above-mentioned synchronous pulses $\phi 1$, $\phi 2$ (minimum voltage when the transistor is of n-type and maximum voltage when the transistor is of p-type), or which will be the source voltage of the first or the second synchronous pulse $\phi 1$, $\phi 2$ which is not less than the threshold voltage value of MOS transistor NMT4.

Such a connection is adopted in a next stage and succeeding stages in a similar manner, wherein the gate terminal of the MOS transistor NMT7 is connected to a gate terminal of a MOS transistor NMT9 corresponding to the MOS transistor NMT4 in the next stage.

With respect to the shift register having such a constitution, as shown in FIG. 1A, one side of load capacitances CS1, CS2, CS3, . . . is respectively connected to the nodes N1, N3, N5, . . . which can be floating, and the other side of these load capacitances CS1, CS2, CS3 . . . is connected to a fixed potential VBIAS. Due to such a constitution, the above-mentioned equation (9) can be rewritten as following equation (11).

$$VN3 = V\phi \times (Cdg5/(Cdg5+CN3+CS2)) \quad (11)$$

Here, the capacitance CS2 constitutes a design parameter and, at the same time, can be formed of a direct parallel plate capacitance. Even when the capacitance CN3 is ignored, the output VN3 can be expressed by the following equation (12).

$$VN3 = V\phi \times (Cdg5/(Cdg5+CS2)) < Vth \quad (12)$$

Further, the following equation (13), which is formulated by adding the capacitance CS (CS2 from node N3) to the previously mentioned equation (4), is satisfied.

$$VN1 = (V\phi - Vth) + V\phi(Cb/(Cb+CS+cs)) > V\phi + Vth \quad (13)$$

From the above, the design tolerance, in the case in which the above-mentioned unstable elements are eliminated can be expanded so that the stable dynamic ratioless shift register which includes thin film transistors formed of polycrystalline silicon can be realized.

Figure 3A:
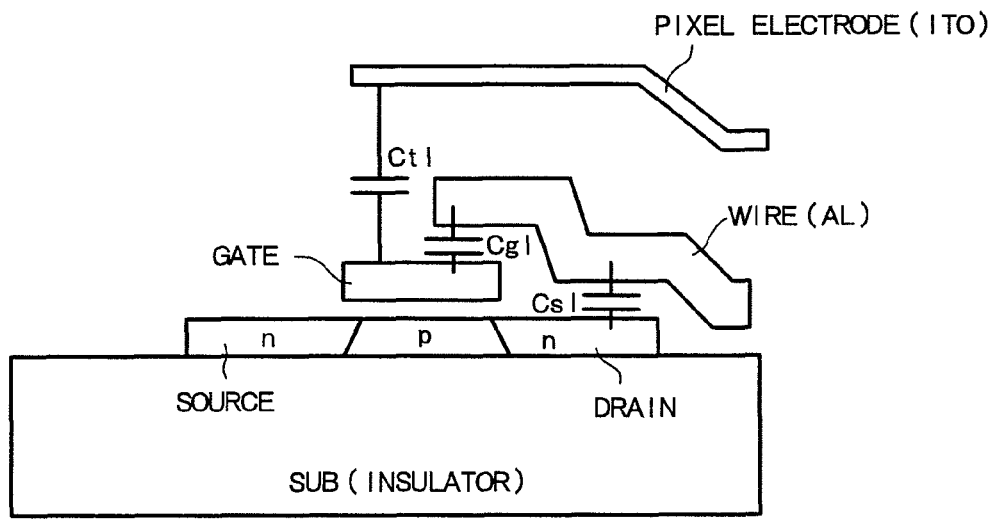
FIGS. 3A to 3C are diagrams showing the capacitance or the like which is generated by a thin film transistor which constitutes a shift register formed on a substrate of display device according to the present invention.

FIG. 3A is a cross-sectional view of a thin film transistor which constitutes a circuit in which the above-mentioned dynamic ratioless shift register is formed on the transparent substrate SUB1. In forming the load capacitance CS in this thin film transistor, the capacitance Cs1 between the polysilicon thin film and the wiring material, the capacitance CgI between the gate forming thin film and the wiring material, the capacitance Ctg between the gate forming thin film and the pixel electrode, the capacitance Ct1 between the wiring material and the pixel electrode or the like can be designated a specific candidate.

In the above-mentioned constitution, the added load capacitance CS performs an important role from the viewpoint of stable operation of the circuit and can enhance the degree of freedom of design. However, the load capacitance CS totally constitutes a parasitic capacitance from the view point of a bootstrap efficiency.

Figure 3B:
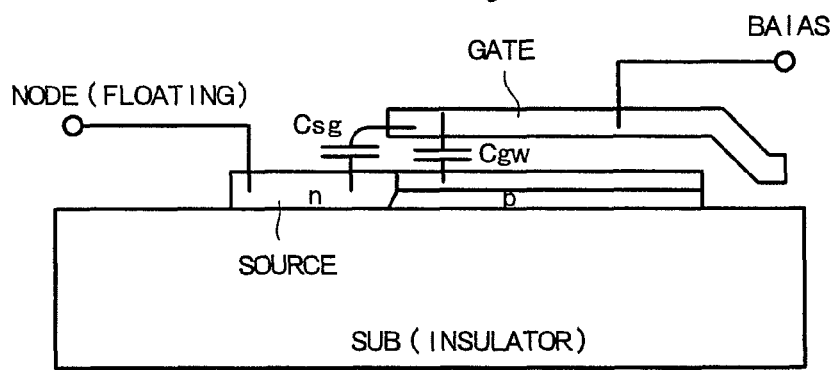
Figure 3C:
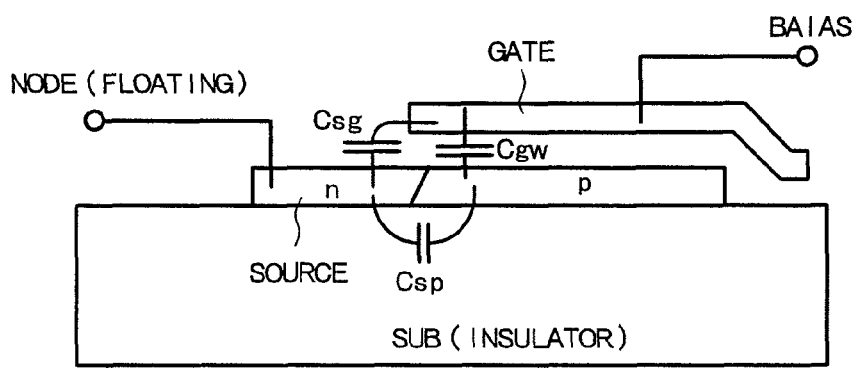

Accordingly, the MOS capacitance shown in FIG. 3B and FIG. 3C are formed as the load capacitance CS, and the bootstrap efficiency can be enhanced with such load capacitance CS. That is, assuming that the fixed voltage VBIAS is set as expressed in a following equation (14), $$Vth < VBIAS < V\phi - 2Vth \quad (14)$$

and the source side is connected to the floating node and the gate side is connected to the bias, a variable capacitance, can be generated in which, when the floating node (N3, N5, ...) is "L", an inversion layer is formed so that the capacitance becomes large (CSL), while when the floating node (N3, N5, ...) is "H", the inversion layer is not present, so that the capacitance becomes small. (CSS). That is, the relationship expressed by a following equation (15) can be obtained.

$$CSL >> CSS \quad (15)$$

Accordingly, the above-mentioned equations (12)(13) are respectively rewritten as following equations (16), (17) so that the stabilized capacitance becomes heavy and the bootstrap efficiency can be enhanced.

$$VN3 = V\phi \times (Cdgs/(CdgS+CSL)) < Vth \quad (16)$$

$$VN1 = (V\phi - Vth) + (Cb/(Cb+CSS+Cs)) > V\phi + Vth \quad (17)$$

Figure 4:
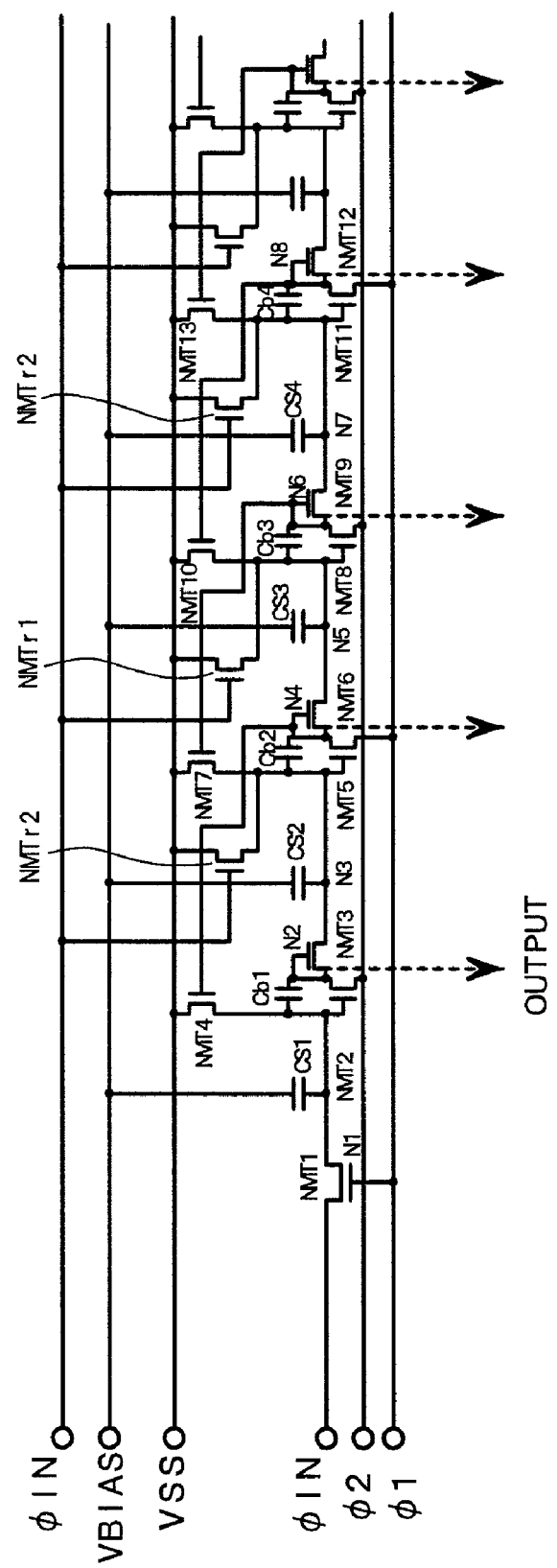
FIG. 4 is a schematic circuit diagram showing another embodiment of a shift register formed on a substrate of a display device according to the present invention.

FIG. 4 shows another embodiment which represents a further improvement over the circuit shown in FIG. 1.

In this embodiment, assuming a circuit which forms the first output of a next stage and a circuit which forms the second output in a subsequent stage in an inputting part as basic circuits, a MOS transistor NMTr2 is incorporated into the first-stage basic circuit and a MOS transistor NMTr1 and the MOS transistor NMTr2 are incorporated into the respective subsequent-stage basic circuits. In each basic circuit, the MOS transistor NMTR2 has the first terminal thereof connected to the seventh MOS transistor NMT4, or the first terminal of a MOS transistor corresponding to the seventh MOS transistor NMT4 and a gate terminal thereof connected to an input terminal of an input pulse φIN.

Then, the second terminal of the MOS transistor NMTr2 is connected to a fixed power source or to a ground potential which is equal to a voltage which becomes a source voltage of the MOS transistor out of voltages of respective synchronous pulses φ1, φ2 (the minimum voltage when the MOS transistor is of n-type and the maximum voltage when the MOS transistor is of p-type), or which will be the source voltage of the first or second synchronous pulse φ1, φ2 which is not less than the threshold voltage value of the fourth MOS transistor.

Further, the transistor NMTr1 has the first terminal thereof connected to the fourth MOS transistor NMT4 or the first terminal of a MOS transistor corresponding to the fourth MOS transistor NMT4 and a gate terminal thereof connected to the input terminal of the input pulse φIN.

Then, the second terminal of the MOS transistor NMTr2 is connected to a fixed power source or to a ground potential which is equal to a voltage which becomes a source voltage of the MOS transistor out of voltages of respective synchronous pulses φ1, φ2 (the minimum voltage when the MOS transistor is of n-type and the maximum voltage when the MOS transistor is of p-type) or which will be the source voltage of the first or second synchronous pulse φ1, φ2 which is not less than the threshold voltage value of the fourth MOS transistor.

The dynamic ratioless shift register having such a constitution performs a resetting effect such that, when respective nodes are in an unstable circumstance such as at the timing of supplying electricity, the circumstance can be improved.

Figure 5:
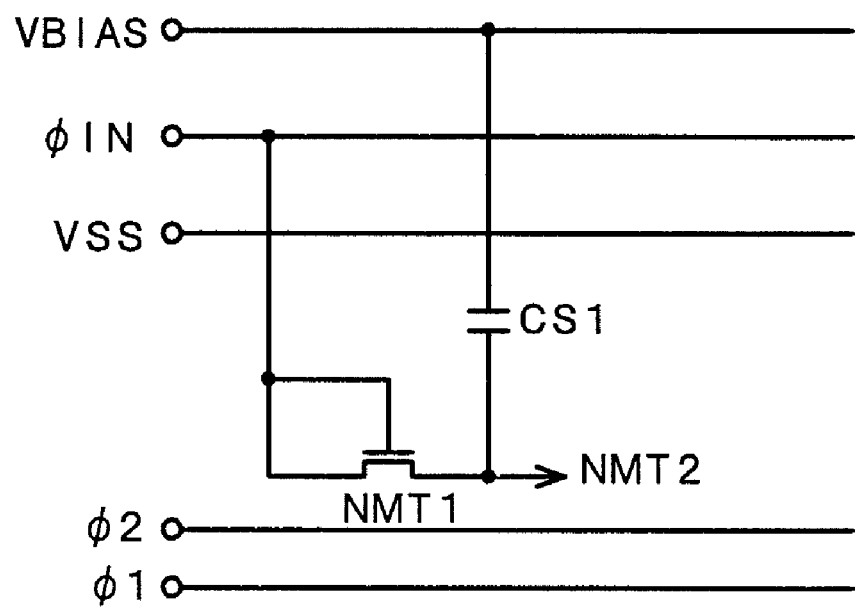
FIG. 5 is a schematic circuit diagram showing another embodiment of a shift register formed on a substrate of a display device according to the present invention.

Further, in the above-mentioned respective circuits, the input part is not limited to the part shown in FIG. 1A and may be constituted as shown in FIG. 5 in which one terminal and the gate terminal of the MOS transistor NMT1 are connected to an input terminal of the input pulse φIN. With this arrangement, substantially the same effect can be obtained.

Embodiment 2

Figure 6A:
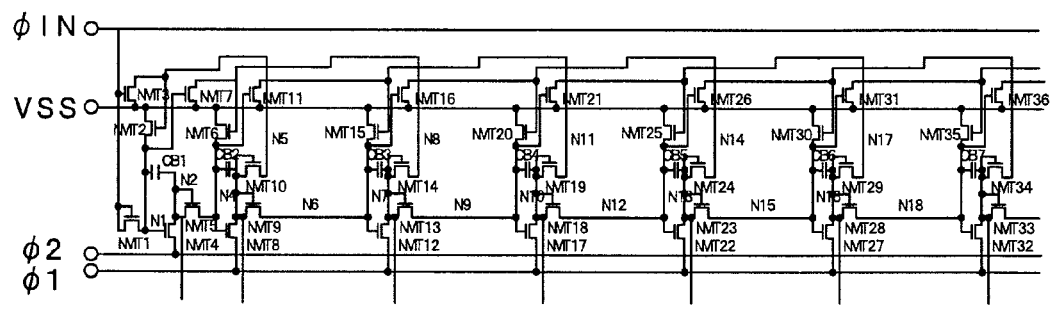
FIG. 6A is a schematic circuit diagram and FIG. 6B is a timing chart showing another embodiment of a shift register formed on a substrate of a display device according to the present invention.

FIG. 6A is a circuit diagram which shows another embodiment of a shift register formed in a liquid crystal display device according to the present invention. This embodiment is constituted differently from the embodiment 1 in which the OFF level is held by adding the load capacitance. That is, this embodiment is constituted such that a circuit is added which changes an input gate of a shift register which is not selected to "L". That is, as shown in FIG. 6A, first of all, aMOS transistor NMT1 has the first terminal and a gate terminal thereof connected to an input terminal of an input pulse (PIN thus forming an inputting part.

The MOS transistor NMT1 has the second terminal thereof connected to a gate terminal of a MOS transistor NMT4 and the first terminal of a MOS transistor NMT2. Further, the second terminal of the MOS transistor NMT1 is connected to the first terminal of a capacitance element CB1. The second terminal of a capacitance element CB2 is connected to the second terminal of a MOS transistor NNT4 and the first terminal and a gate terminal of a MOS transistor NMT5.

The first terminal of the MOS transistor NMT2 is connected to a gate terminal of a MOS transistor NMT7 and a gate terminal of the MOS transistor NNT2 and the second terminal of a MOS transistor NMT3 are connected to the second terminal of a MOS transistor NMT10.

The second terminal of the MOS transistor NMT2 is connected to a fixed power source VSS or a ground potential (VDD) which is equal to a voltage, which becomes a source voltage of the MOSTFT out of the voltages of the first and second synchronous pulses φ1, φ2, or which will be the source voltage of the first or second synchronous pulse φ1, φ2 which is not less than the threshold value voltage of the MOS transistor NMT4.

Further, the second terminal of the MOS transistor NMT3 is connected to the fixed power source VSS or the ground potential (VDD), which is equal to the voltage which becomes the source voltage of the MOSTFT out of the voltages of the first and second synchronous pulses φ1, φ2, or which is not different from the voltage which becomes the source voltage of the first or second synchronous pulse φ1, φ2 to an extent that the fixed power source or the ground potential at least does not exceed a threshold value voltage of the MOS transistor NMT4.

The first terminal of the MOS transistor NMT4 is connected to the input terminal of the synchronous pulse φ2, while the second terminal of the MOS transistor NNT5 is connected to a gate terminal and a first terminal of a MOS transistor NMT6, and is further connected to the first terminal of the capacitance element CB2.

The second terminal of the capacitance element CB2 is connected to the second terminal of a MOS transistor NMT8, the first terminal and the gate terminal of a MOS transistor NMT9 and the first terminal and the gate terminal of the MOS transistor NNT1 thus constituting a first output terminal.

The first terminal of the MOS transistor NMT6 is connected to a gate terminal of a MOS transistor NMT11, while the second terminal of the MOS transistor NMT11 is connected to the fixed power source VSS or to the ground potential (VDD), which is equal to the voltage which becomes the source voltage of the MOSTFT out of the voltages of the first and second synchronous pulses φ1, φ2, or which will be the source voltage of the first or second synchronous pulse φ1, φ2 which is not less than the threshold value voltage of the MOS transistor NNT4.

The first terminal of the MOS transistor NMT8 is connected to the input terminal of the synchronous pulse φ1 and the second terminal of the tenth MOS transistor NMT9, thus constituting a second output terminal. The gate terminal of the MOS transistor NMT6 and the first terminal of the MOS transistor NMT7 are connected to the second terminal of other MOS transistor, which corresponds to the previously-mentioned MOS transistor NMT10 of a circuit of next stage which adopts a constitution similar to that of the above-mentioned circuit.

Figure 6B:
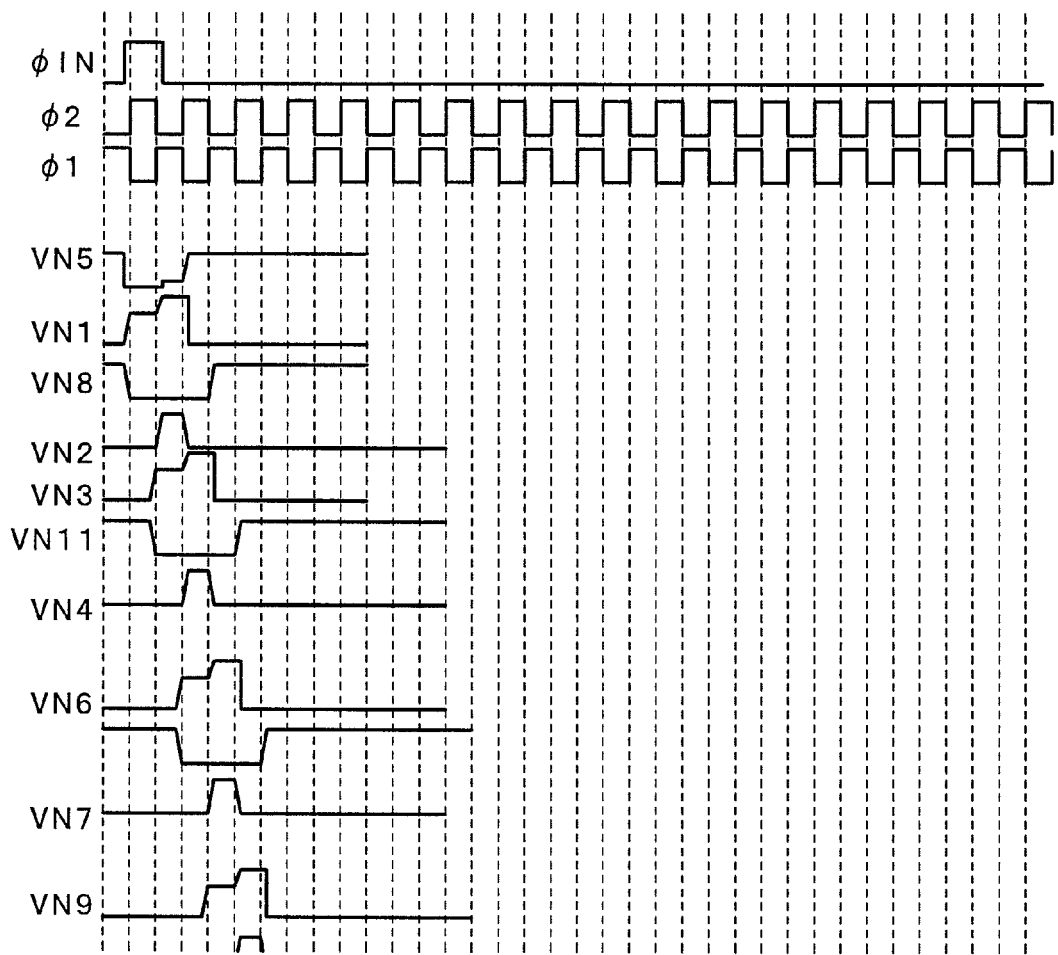

The manner of operation of the shift register having such a constitution will be described hereinafter in conjunction with the timing chart shown in FIG. 6B. When the input pulse φIN is changed such that "L" ▷"H" at the time t0, the MOS transistor NMT3 is turned ON so that the node N5 and the ground potential VSS(=GND) are connected so that the outputs VN5, VSS become VN5=VSS, the MOS transistor NMT2, which uses node N5 as the gate turns OFF and the node N1 becomes the floating state.

At this point of time, the output VN1 of the node N1 simultaneously becomes such that VN1=Vφ−Vth due to the diode connection of the MOS transistor NMT1. When the relationship Vφ−Vth>Vth is established, since VN1=Vφ−Vth, the MOS transistor NMT7 also turns ON so that the node N8 and the ground potential VSS(=GND) are connected, whereby the relationship VN8=VSS is established. Further, the MOS transistor NMT6, which uses the node N5 as the gate, turns OFF, and the node N3 becomes the floating state.

At this point of time; among the MOS transistors NMT5 which have the drains thereof connected to the synchronous pulses φ1, φ2, only the gates of the MOS transistor NNT4 and the MOS transistor NMT7 become the floating state. When the synchronous pulse φ2 is changed such that "L" ▷"H" at the time t1, since the MOS transistor NMT4 is in the ON state, the potential of the node N2 rises and the potential VN2 becomes VN2=Vφ due to the bootstrap capacitance CB1 as mentioned previously.

At this point of time, due to the boosting of voltage at the node N1, the output VN1 rises until the voltage v1 becomes VN1=(Vφ−Vth)+Vφ(Cb/(Cb+Cs)). However, the input pulse φIN is in the "H" state and the gate of the MOS transistor NMT2 is set to the relationship VSS (=GND) so that the forced OFF state is held.

Then, due to the MOS transistor NMT5, which is subjected to the diode connection, the output VN3 becomes VN3=Vφ−Vth. Accordingly, the MOS transistor NMT11, which uses the node N3 as the gate becomes the ON state, so that the node N11 is changed such that "H" ▷"L", the MOS transistor NNT15 turns OFF, and the node N6 becomes the floating state.

At this point of time t2, the synchronous pulse φ1 is changed such that "L" ▷"H", while the synchronous pulse φ2 is changed such that "H" ▷"L". Although the output VN2 becomes "H" ▷"L" when the synchronous pulse φ2 is changed such that "H" ▷"L", the output VN3 is held at "H". When the synchronous pulse φ1 is changed such that "L" ▷"H", the output VN4 of the node N4 becomes VN4=Vφ through the MOS transistor NMT8, which is in the ON state.

Accordingly, the MOS transistor NMT16 which uses the node N6 as the gate becomes the ON state and the node N14 is changed such that "H" ▷"L" so that the MOS transistor NMT20 becomes the OFF state and the node N9 becomes the floating state.

Simultaneously, due to the MOS transistor NMT10, which is subjected to the diode connection, the output VN5 becomes VN5=Vφ−Vth. Accordingly, the MOS transistor NMT2 which uses the node N5 as the gate becomes the ON state so that the node N1 and the ground potential VSS are connected to each other and the MOS transistor NMT4 is forced OFF, in which the gate of the MOS transistor NMT4 is connected to the ground potential VSS. Since the MOS transistor NMT10 is subjected to the diode connection, even when the output VN4 becomes VN4="L" thereafter, the output VN5 holds the "H" state (previously-mentioned a element being omitted for the sake of brevity). That is, until the input pulse φIN becomes "H" again, the forced OFF state in which the gate of the MOS transistor NNT4 is connected to the fixed power source VSS is held.

At a point of time t3, the synchronous pulse φ2 is changed such that "L" ▷"H", while the synchronous pulse φ1 is changed such that "H" ▷"L". Although the output VN4 becomes "H" ▷"L" when the synchronous pulse φ1 is changed such that "H" ▷"L", the output VN6 is held at "H". When the synchronous pulse φ2 is changed such that "L" ▷"H", the output VN7 of the node N7 becomes VN7=Vφ through the MOS transistor NMT12 which is in the ON state.

Due to the MOS transistor NMT13, which is subjected to the diode connection, the output VN9 becomes VN9=Vφ−Vth. Accordingly, the MOS transistor NNT21, which uses the node N9 as the gate, turns ON and the node N14 is changed such that "H" ▷"L" so that the MOS transistor NNT25 turns OFF and the node N12 becomes the floating state.

Simultaneously, due to the MOS transistor NMT14, which is subjected to the diode connection, the output VN8 becomes VN8=Vφ−Vth. Accordingly, the MOS transistor NMT6, which uses the node N8 as the gate, turns ON so that the node N3 and the ground potential VSS are connected to each other and the MOS transistor NNT8 forced OFF in which the gate of the MOS transistor NMT8 is connected to the ground potential VSS. Since the MOS transistor NMT14 is subjected to the diode connection, even when the output VN7 becomes VN7="L" thereafter, the output VN8 holds the "H" state (previously-mentioned a element being omitted for the sake of brevity). That is, until the voltage VIN becomes the "H" again, the forced OFF state in which the gate of the MOS transistor NNT4 is connected to the ground potential VSS is held.

Thereafter, the shift register is operated by sequentially repeating the above-mentioned operations.

The shift register having the above-mentioned constitution is configured such that, among the MOS transistors which are connected to the synchronous pulses φ1 and φ2, unnecessary gates are all connected to the ground potential VSS. Accordingly, it becomes possible to make the MOS transistor assume the forced OFF state so that the occurrence of instability in operation can be obviated.

Figure 8:
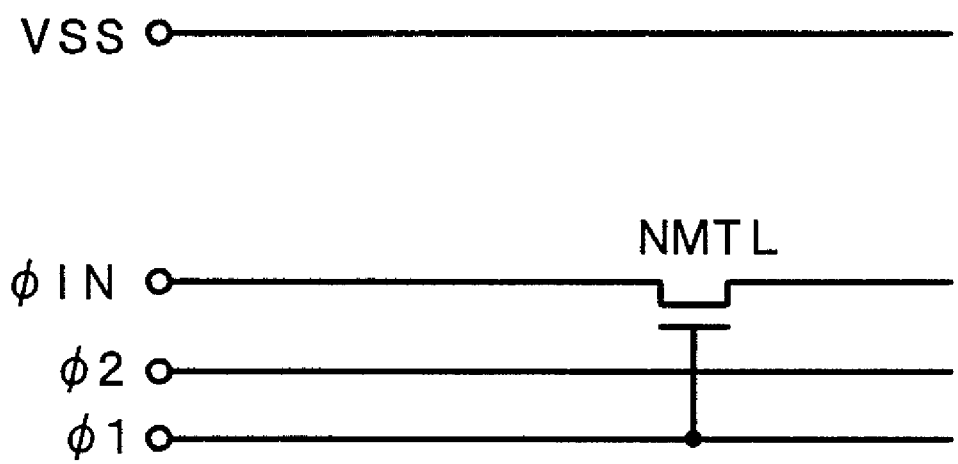
FIG. 8 is a schematic circuit diagram showing another embodiment of a shift register formed on a substrate of a display device according to the present invention.
Figure 9A:
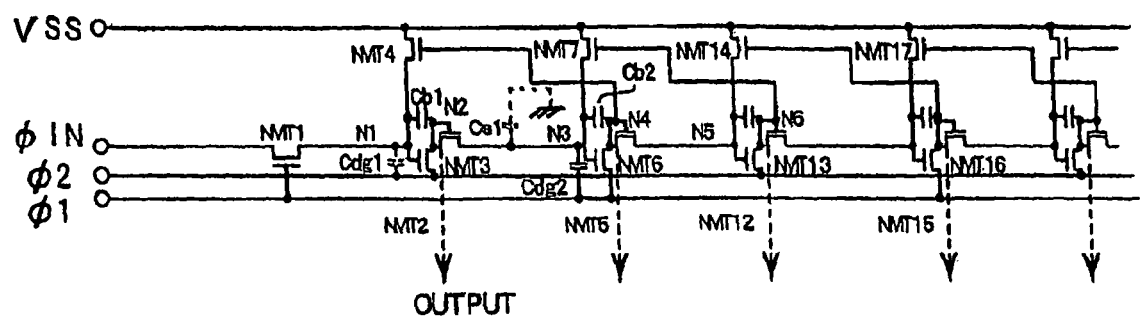
FIG. 9A is a schematic circuit diagram and FIG. 9B is a timing chart showing one example of a dynamic ratioless shift register formed on a monocrystalline semiconductor layer.
Figure 9B:
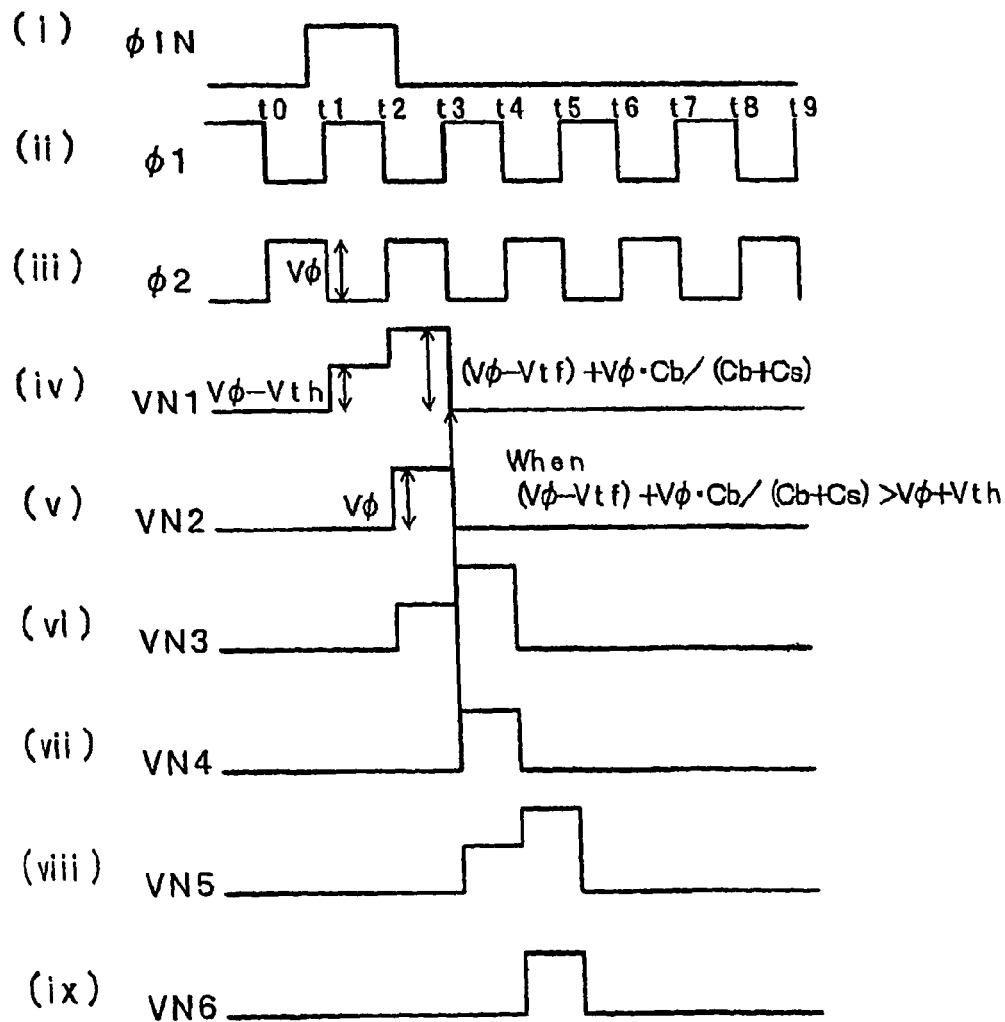
Figure 10A:
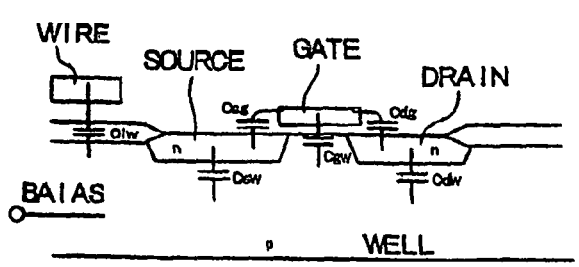
FIGS. 10A to 10F are diagrams which indicate the difference between a case in which the dynamic ratioless shift transistor is formed on a glass substrate and a case in which the dynamic ratioless shift transistor is formed on a monocrystalline semiconductor layer.
Figure 10D:
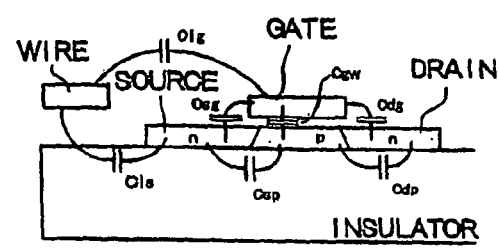
Figure 10B:
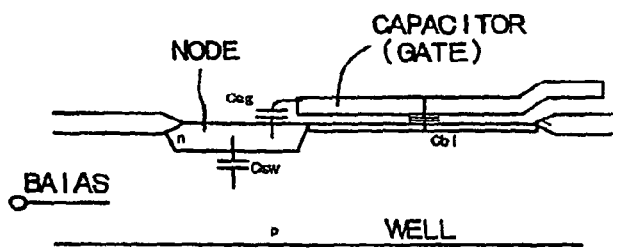
Figure 10E:
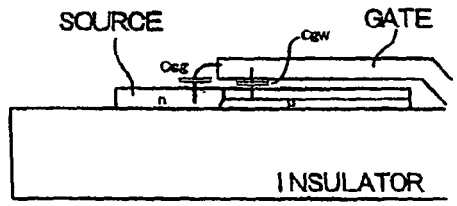
Figure 10C:
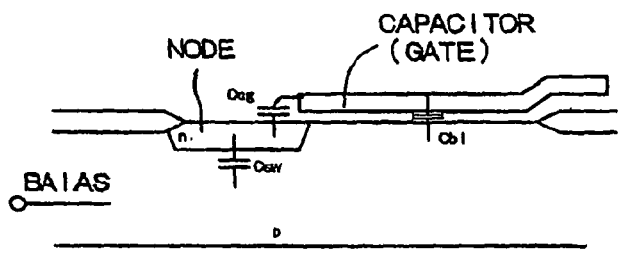
Figure 10F:
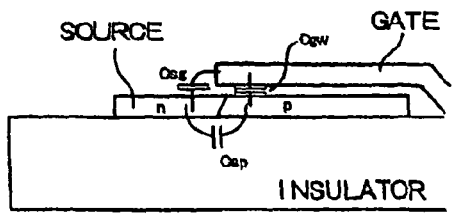

In the above-mentioned embodiment, the input part is not limited to the constitution shown in FIG. 6A. That is, as shown in FIG. 8, the input part may be constituted such that the first terminal of the MOS transistor NNT1 is connected to the input terminal of the input pulse φIN and the gate terminal of the MOS transistor NNT1 is connected to the input terminal of the synchronous pulse φ. With this configuration, substantially the same advantageous effects can be obtained.

Embodiment 3

Figure 7A:
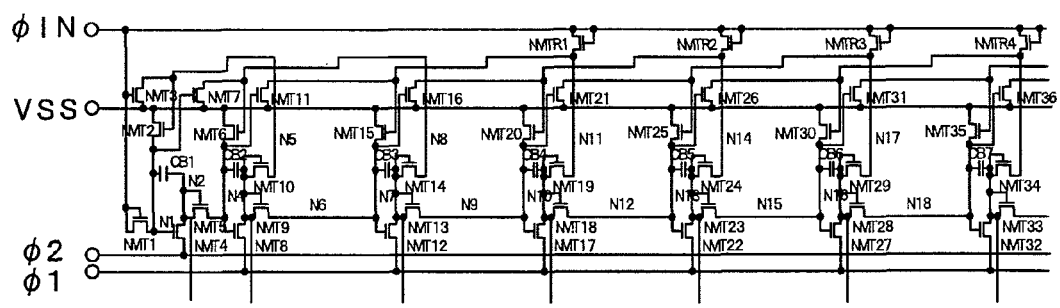
FIG. 7A is a schematic circuit diagram and FIG. 7B is a timing chart showing another embodiment of a shift register formed on a substrate of a display device according to the present invention.
Figure 7B:
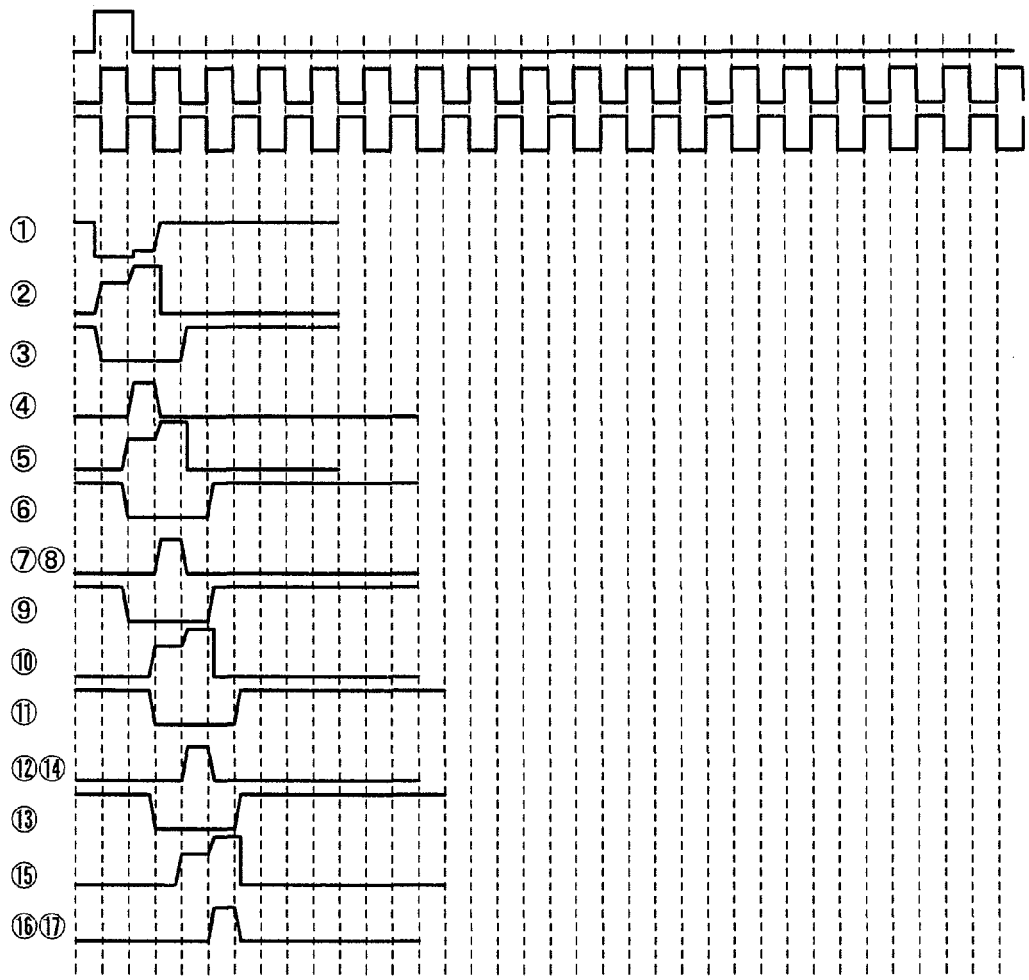

FIG. 7A is a circuit diagram which shows another embodiment of the shift register formed on the liquid crystal display device of the present invention.

In the drawing, a circuit is constituted such that thin film transistors NNTR1, NMTR2, NNTR3, . . . which are subjected to the diode connection using respective nodes N11, N14, N17, as sources thereof and the input pulse signal (PIN as drains and gates thereof are connected to the circuit exemplified in the embodiment 2.

These respective thin film transistors NMTR1, NNTR2, NMTR3, . . . reinforce the "H" level of respective nodes in the floating state when the input pulse signal φIN becomes the "H" state, thus making the forced OFF state of the non-selected input gate more reliable.

Further, an advantageous effect is obtained in that, at the start of scanning immediately after the supply of electricity, an initialization equal to that of the normal operating state can be performed.

Although the thin film transistors which constitute the shift register have been described as n-type transistors in the above-mentioned respective embodiments, it is needless to say that p-type transistors can be used as the thin film transistors. This is because, by using the absolute potential of "H" and "L" levels of respective signals in an inverted manner, the advantageous effects of the present invention can be obtained substantially in the same manner.

Further, although the thin film transistors are exemplified as MOS transistors whose gate insulation films are made of $SiO_2$, for example, in the above-mentioned respective embodiments, it is needless to say that the gate insulation films may be made of SiN, for example.

Embodiment 4

Figure 11:
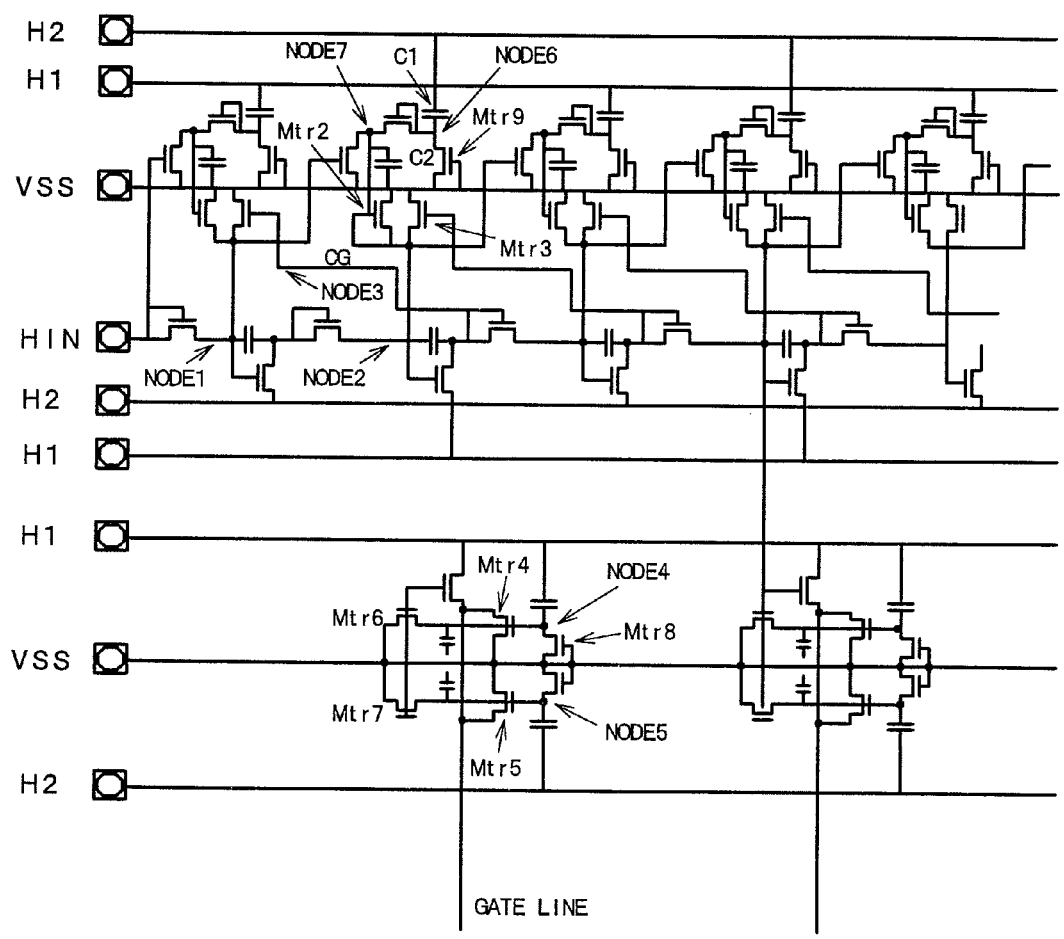
FIG. 11 is a schematic circuit diagram showing another embodiment of the dynamic ratioless shift register used in the display device according to the present invention.
Figure 12:
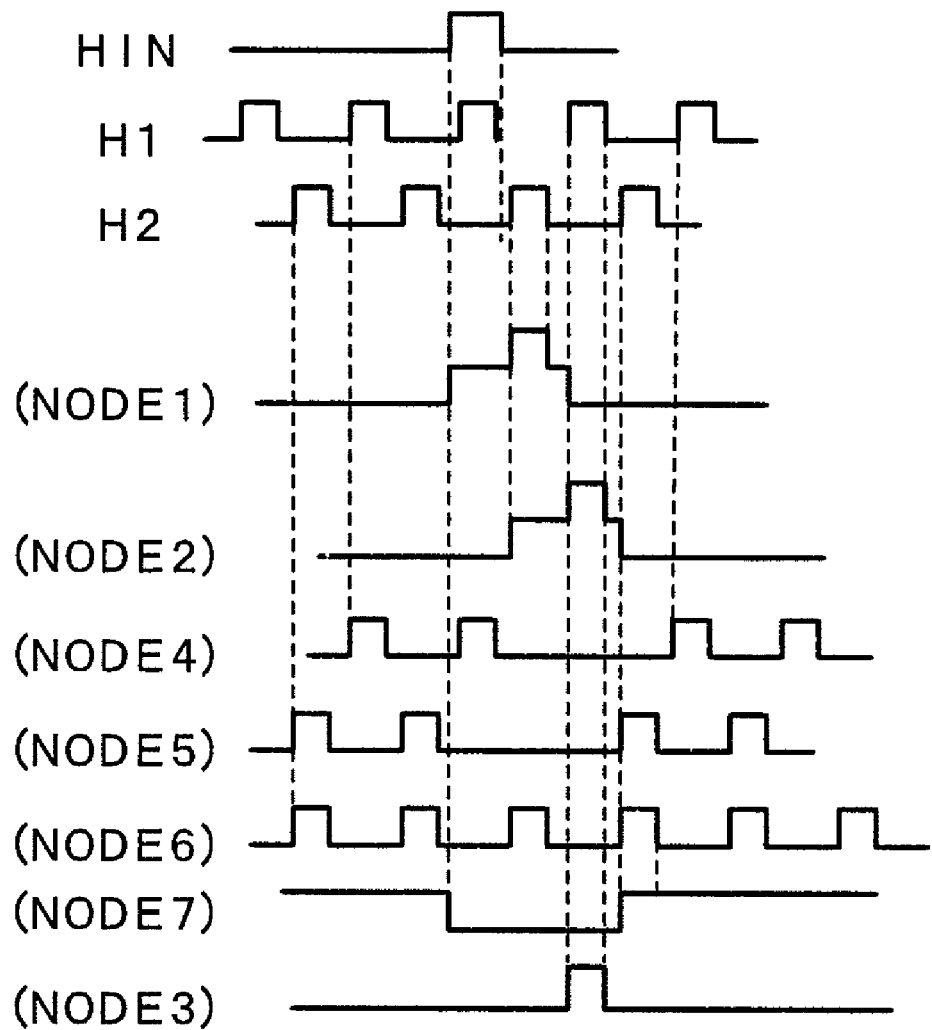
FIG. 12 is an input pulse timing chart for the circuit shown in FIG. 11.

FIG. 11 is a circuit diagram showing another embodiment of a ratioless-type dynamic shift register which is used in the display device of the present invention. That is, this embodiment shows a further improvement of the dynamic shift registers shown in the above-mentioned respective embodiments. Further, FIG. 12 shows an input pulse timing chart of the circuit shown in FIG. 11.

Figure 13:
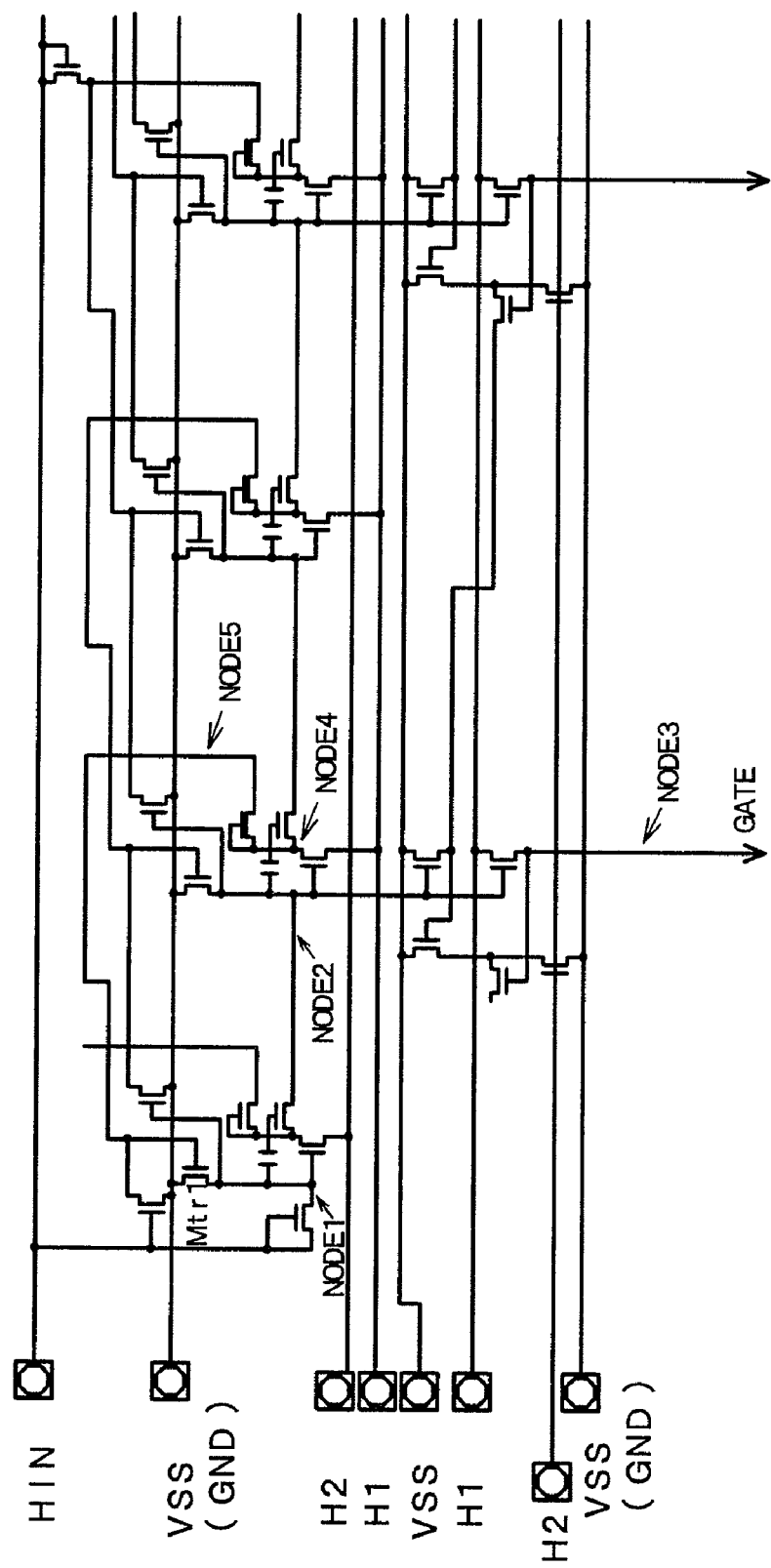
FIG. 13 is a schematic circuit diagram provided for comparison to clarify a characterizing portion of the circuit shown in FIG. 11.
Figure 14:
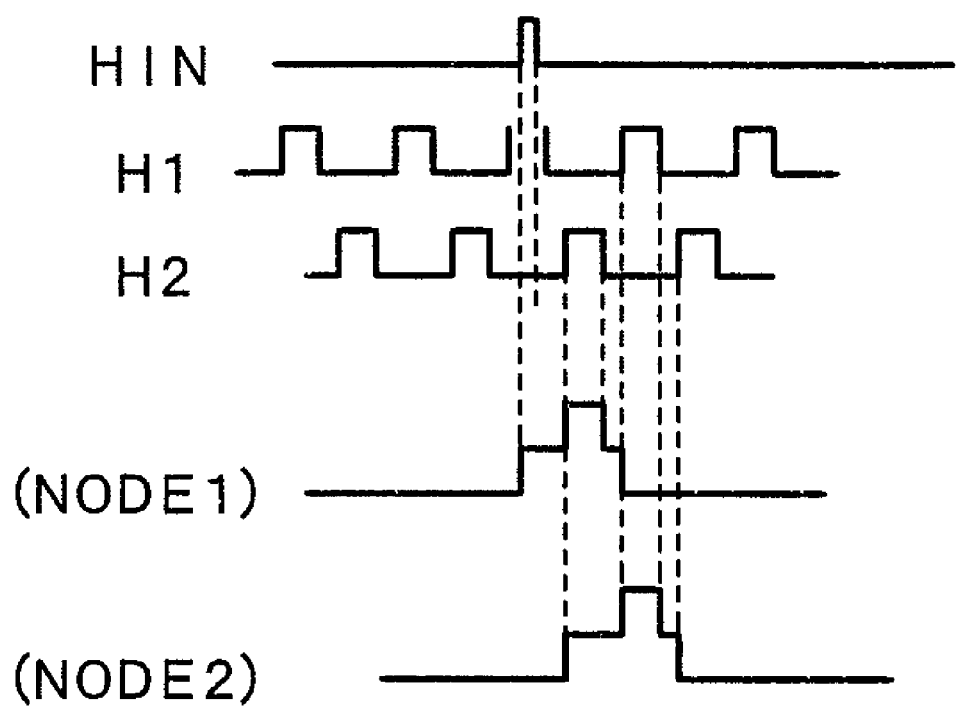
FIG. 14 is an input pulse timing chart for the circuit shown in FIG. 11.

Here, to clarify the characterizing portion of the ratioless-type dynamic shift register which is used in the display device of the present invention, a circuit diagram which is used for comparison is shown in FIG. 13. Further, FIG. 14 shows an input pulse timing chart of the circuit shown in FIG. 13.

Figure 15A:
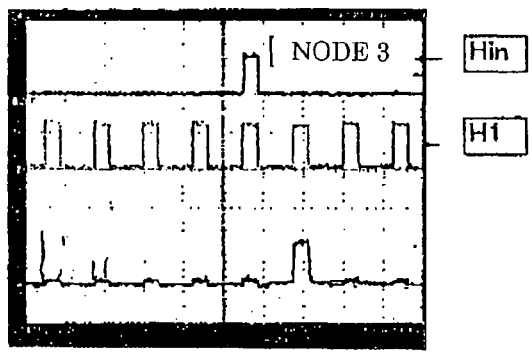
FIGS. 15A to 15E are waveform diagrams showing inconvenient points in explaining the circuit shown in FIG. 13 and the circuit shown in FIG. 11.

In such a circuit, a jumping of the H1 clock is observed at a VSS (GND) level of a node 3 in FIG. 13. FIG. 15A illustrates this phenomenon, wherein an H1 clock after an input signal Hin appears at the VSS (GND) level (lower side of the drawing) of the node 3.

Figure 15D:
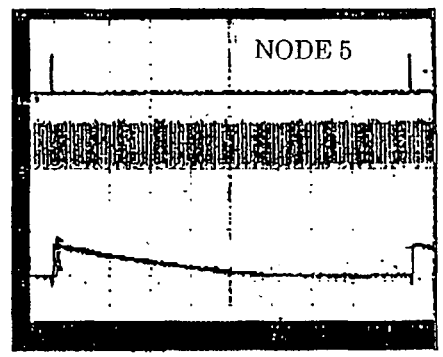
Figure 15B:
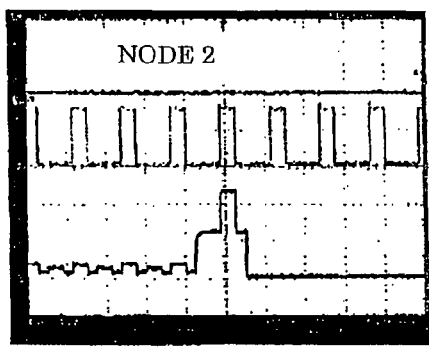
Figure 15E:
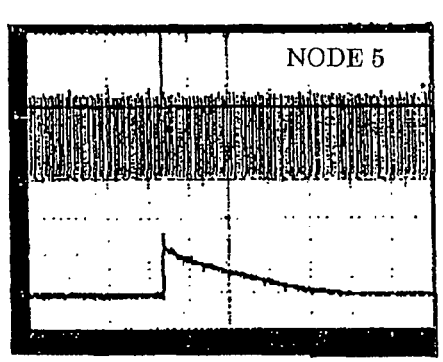
Figure 15C:
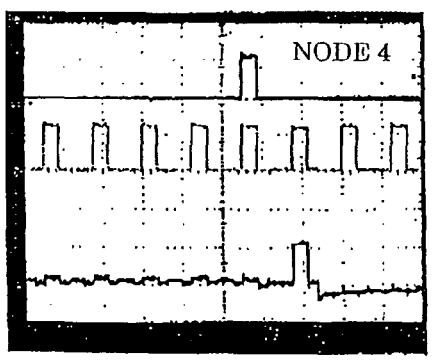

Due to a pulse which enters a node 5 through a diode from a node 4 shown in FIG. 13, a MIS transistor MtrI is turned ON. If this state continues until the next frame time is over (if leakage does not occur at the node 5), no problem arises. However, in actual operation as shown in FIG. 15D, the leakage of signals occurs at the node 5.

Accordingly, the above-mentioned MIS transistor MtrI turns OFF and, hence, the node 1 becomes the floating state and unstable. The similar phenomenon occurs also at the node 2.

In view of the above, in the ratioless dynamic shift register of this embodiment, which is used in the present invention, to a MIS transistor Mtr2 which is connected to ground levels of respective outputs of respective stages of the dynamic shift register, a MIS transistor Mtr3, which is provided separately from the MIS transistor Mtr2, is connected in parallel.

That is, the MIS transistor MtrI shown in FIG. 13, which drops the potential level of the node 2 to the ground potential vSS (GND), is, first of all, constituted of the MIS transistor Mtr2 and the MIS transistor Mtr3, which are connected in parallel.

In such a constitution, the MIS transistor Mtr3 has a function similar to that of the MIS transistor Mtr1 shown in FIG. 13, while the MIS transistor Mtr2 has a function of always dropping the node 1 to the VSS level, except for a case in which a High signal is supplied to the node 1 shown in FIG. 11.

To be more specific, the gate of the MIS transistor Mtr2 is always held at the High state due to a potential charged in response to an H2 clock.

To avoid a phenomenon in which the charge which is charged to the node 7 leaks to the node 6 as a diode inverse current due to the lowering of the potential of the node 6 below the ground potential VSS, a MIS transistor Mtr9 is provided.

In connection with the ratioless dynamic shift register having such a constitution, a step for charging the charge to the node 7 will be explained.

First of all, since the node 6 constitutes a floating node (the node which is not connected to the power supply), the node 6 is oscillated in response to the timing of a clock H2 (see the waveform chart of the node 6 shown in FIG. 12).

During the period in which the node 1 is set to "High", the potential at the node 7 is dropped to the VSS level and becomes the floating state while holding this potential.

Thereafter, when the node 6 is elevated due to the clock H2, the current flows through the diode, and even when the potential of the node 6 is lowered, the charge is held due to the inverse-direction connection of the diode (see the waveform chart of the node 7 shown in FIG. 12).

Assuming that the charge held by the node 7 is lost due to a sort of leakage of current, the node 6 is oscillated in response to the timing of the clock H2 so that the node 7 is charged again immediately. Accordingly, the potential is set such that the potential is not lowered below (VSS−(Vth of Mtr8)) with the provision of the transistor Mtr9.

When the potential of the node 6 is set to the ground potential VSS, the potential held by the node 7 is expressed by an equation ((High of amplitude of the node 6)−(Vth of the diode)). Further, the amplitude of the node 6 is determined by the capacitance C1 and other floating capacitance C0 and is expressed by an equation ((High of the clock H2)×C1/(Ci+CO)).

Further, in the ratioless dynamic shift register shown in FIG. 11, with respect to the ground levels other than signals of High level in the outputs of respective stages, means which surely drops the outputs to the ground levels is constituted of MIS transistors Mtr4, Mtr5, Mtr6, Mtr7 and MtrB.

First of all, the MIS transistors Mtr4 and Mtr5 will be described. The waveforms of the node 4 and the node 5 are formed as shown in the timing chart of FIG. 12 in response to the clocks H1, H2, respectively.

The node 4 and the node 5 become the ON state when the clocks H1, H2 become High and drop the potential of the node to the gate signal line to the VSS level thus performing a role to make the node stable.

In this case, when the node 2 is at the High level (when the High level signal is outputted to the gate signal line), the MIS transistors Mtr6 and Mtr7 are turned ON and the potentials of the node 4 and the node 5 are dropped to the VSS level so that the MIS transistors Mtr4 and Mtr5 are turned OFF.

The MIS transistor Mtr8 is connected to prevent the potential of the node 4 from becoming smaller than (VSS−(Vth of Mtr8)). When the potential of the node 4 is largely lowered from the ground potential VSS, the amplitude of the clocks H1, H2 does not meet the threshold voltage Vth of the MIS transistors Mtr4, Mtr5 (the potential equal to or more than VSS+Vth being necessary to turn on the MIS transistors Mtr4, Mtr5) and hence, the provision of MIS transistors Mtr8 becomes meaningless.

Further, as shown in FIG. 11, this embodiment includes a MIS transistor Mtr2 which is connected to the ground levels of respective outputs of respective stages, and a MIS transistor which is operated with an output of the front stage and has one end thereof connected to the ground level and the other end thereof connected to the H2 clock through the capacitance element C1 and further connected to the gate of the MIS transistor Mtr2. A capacitance C2 is disposed between the other end of the MIS transistor Mtr2 and the ground level.

When the potential of the node 1 is dropped to the VSS level due to the node 3, the node 7 becomes the floating node which is not connected to the VSS level and, simultaneously, the node 2 is elevated in response to the Hi clock.

At this point of time, there exists a possibility that the gate (node 7) is elevated due to the capacitance CG between the gate and the drain of the MIS transistor Mtr2 so that the node 2 is connected with the ground potential VSS. To prevent such a phenomenon, the capacitance C2 is provided.

Accordingly, a boosted amount of potential at the node 7 becomes CG/(CG+C2+other floating capacitance) times so that by increasing the capacitance C2 compared to CG, the elevated amount of potential becomes a value which can be ignored.

Although the present invention has been explained with respect to dynamic ratioless shift registers which are provided for liquid crystal devices, for example, in the respective embodiments, the present invention is not limited to these shift registers and it is needless to say that the present invention is applicable to dynamic ratioless shift registers which are provided for EL display devices, for example.

As has been described heretofore, according to the present invention, the display device which includes the dynamic ratioless shift register which is operated in a stable manner and can expand the degree of freedom of designing can be realized.

The invention claimed is:

1. A display device comprising:
a display panel; and
a display driving circuit including a ratioless dynamic shift register formed on the display panel, the ratioless dynamic shift register including a connection of a plurality of stages, at least one of the stages including a first transistor and a second transistor, the first transistor including a gate electrode, a first electrode and a second electrode,
wherein a voltage of the gate electrode of the first transistor is boosted by a voltage of the first electrode thereof changing from low level to high level,
wherein the second transistor forms a connection between the gate electrode of the first transistor and a ground voltage line when the second transistor is in an on state, and
wherein a third transistor holds the second transistor in the on state until the first transistor is triggered to the on state.

2. A display device according to claim 1,
wherein an output signal from a preceding stage is inputted into the second transistor of a next stage.

3. A display device according to claim 1,
wherein a first input line for receiving a first synchronous pulse is connected to the first transistor of a preceding state, and
wherein a second input line for receiving a second synchronous pulse is connected to the first transistor of a next stage.

4. A display device comprising:
a display panel; and
a display driving circuit including a ratioless dynamic shift register formed on the display panel, the ratioless dynamic shift register including:
a connection of a plurality of stages,
at least one of the stages including a first transistor and a second transistor,
the first transistor including a control electrode, an input electrode and an output electrode, and being adapted to have a voltage of the control electrode boosted by a clock pulse inputted into the input electrode thereof,
the second transistor connecting the gate electrode of the first transistor and a ground voltage line when the second transistor is in an on state, and being adapted to release restriction of a fluctuation of the voltage of the control electrode of the first transistor by a start signal,
wherein a third transistor holds the second transistor in the on state until the first transistor is triggered to the on state by the start signal.

5. A display device according to claim 4,
wherein an output signal from a preceding stage is inputted into the second transistor of a next stage.

6. A display device according to claim 4,
wherein a first input line for receiving a synchronous pulse is connected to the first transistor of a preceding stage, and
wherein a second input line for receiving a synchronous pulse is connected to the first transistor of a next stage.

7. A display device comprising:
a display panel; and
a display driving circuit including a ratioless dynamic shift register formed on the display panel, the ratioless dynamic shift register including a connection of a plurality of stages, at least one stage including a first transistor, a second transistor and a third transistor, the first transistor including a control electrode, an input electrode and an output electrode,
wherein a clock signal line is connected to the input electrode to input a clock signal to the input electrode,
wherein the voltage of the control electrode of the first transistor is boosted when the clock signal is changing from low voltage to high voltage,
wherein the second transistor connects the control electrode of the first transistor and a fixed voltage when the second transistor is in an on state, and
wherein the third transistor holds the second transistor in the on state until the first transistor is triggered to the on state.

8. A display device according to claim 7,
wherein an output signal from the output electrode of the first transistor of a preceding stage is inputted into the control electrode of the first transistor of a next stage as a start signal.

9. A display device according to claim 7,
wherein the clock signal includes a first clock signal and second clock signal,
wherein a first clock input line for receiving the first clock signal is connected to the input electrode of the first transistor of a preceding stage, and
wherein a second clock input line for receiving the second clock signal is connected to the input electrode of the first transistor of a next stage.

* * * * *